US011862679B2

(12) United States Patent
Choi et al.

(10) Patent No.: US 11,862,679 B2
(45) Date of Patent: *Jan. 2, 2024

(54) SEMICONDUCTOR DEVICE HAVING INCREASED CONTACT AREA BETWEEN A SOURCE/DRAIN PATTERN AND AN ACTIVE CONTACT

(71) Applicant: SAMSUNG ELECTRONICS CO., LTD., Suwon-si (KR)

(72) Inventors: Min-Hee Choi, Suwon-si (KR); Seokhoon Kim, Suwon-si (KR); Choeun Lee, Pocheon-si (KR); Edward Namkyu Cho, Seongnam-si (KR); Seung Hun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/686,700

(22) Filed: Mar. 4, 2022

(65) Prior Publication Data

US 2022/0190112 A1 Jun. 16, 2022

Related U.S. Application Data

(63) Continuation of application No. 16/452,668, filed on Jun. 26, 2019, now Pat. No. 11,302,779.

(30) Foreign Application Priority Data

Jul. 16, 2018 (KR) .......................... 10-2018-0082280

(51) Int. Cl.
*H01L 27/092* (2006.01)
*H01L 29/78* (2006.01)
(Continued)

(52) U.S. Cl.
CPC .. *H01L 29/0847* (2013.01); *H01L 21/823814* (2013.01); *H01L 21/823821* (2013.01);
(Continued)

(58) Field of Classification Search
CPC ........... H01L 27/0924; H01L 27/10826; H01L 27/10879; H01L 29/41791; H01L 29/785; H01L 21/823821; H10B 12/36
See application file for complete search history.

(56) References Cited

U.S. PATENT DOCUMENTS 8,648,408 B2 2/2014 Jeong et al.
8,659,032 B2 2/2014 Chao et al.
(Continued)

FOREIGN PATENT DOCUMENTS

CN 108091653 A 5/2018

*Primary Examiner* — Phat X Cao
(74) *Attorney, Agent, or Firm* — Muir Patent Law, PLLC

(57) ABSTRACT

A semiconductor device including a substrate including an active pattern; a gate electrode crossing the active pattern; a source/drain pattern adjacent to one side of the gate electrode and on an upper portion of the active pattern; an active contact electrically connected to the source/drain pattern; and a silicide layer between the source/drain pattern and the active contact, the source/drain pattern including a body part including a plurality of semiconductor patterns; and a capping pattern on the body part, the body part has a first facet, a second facet on the first facet, and a corner edge defined where the first facet meets the second facet, the corner edge extending parallel to the substrate, the capping pattern covers the second facet of the body part and exposes the corner edge, and the silicide layer covers a top surface of the body part and a top surface of the capping pattern.

11 Claims, 51 Drawing Sheets

(51) Int. Cl.
  *H01L 21/8238* (2006.01)
  *H10B 12/00* (2023.01)
  *H01L 29/08* (2006.01)
  *H01L 29/417* (2006.01)
  *H10B 10/00* (2023.01)

(52) U.S. Cl.
  CPC .... *H01L 27/0924* (2013.01); *H01L 29/41791* (2013.01); *H01L 29/785* (2013.01); *H10B 10/12* (2023.02); *H10B 12/36* (2023.02)

(56) References Cited

U.S. PATENT DOCUMENTS

| | | |
|---|---|---|
| 8,975,144 B2 | 3/2015 | Kwok et al. |
| 9,431,536 B1 | 8/2016 | Wu et al. |
| 9,570,556 B1 | 2/2017 | Lee et al. |
| 9,614,085 B2 | 4/2017 | Liao et al. |
| 9,640,484 B2 | 5/2017 | Lu et al. |
| 9,659,942 B1 | 5/2017 | Basker et al. |
| 9,666,691 B2 | 5/2017 | Su et al. |
| 9,728,645 B2 | 8/2017 | Kim et al. |
| 9,768,178 B2 | 9/2017 | Lee et al. |
| 9,793,404 B2 | 10/2017 | Sung et al. |
| 10,332,898 B2 | 6/2019 | Hong et al. |
| 11,302,779 B2 * | 4/2022 | Choi .............. H01L 29/0847 |
| 2011/0073952 A1 | 3/2011 | Kwok et al. |
| 2013/0193446 A1 | 8/2013 | Chao et al. |
| 2013/0207195 A1 | 8/2013 | Jeong et al. |
| 2014/0001520 A1 | 1/2014 | Glass et al. |
| 2016/0111447 A1 * | 4/2016 | Bryant .............. H01L 29/16 438/157 |
| 2016/0329414 A1 | 11/2016 | Lee et al. |
| 2017/0256639 A1 | 9/2017 | Lee et al. |
| 2017/0365716 A1 | 12/2017 | Chung et al. |
| 2019/0319098 A1 | 10/2019 | Tai et al. |

* cited by examiner

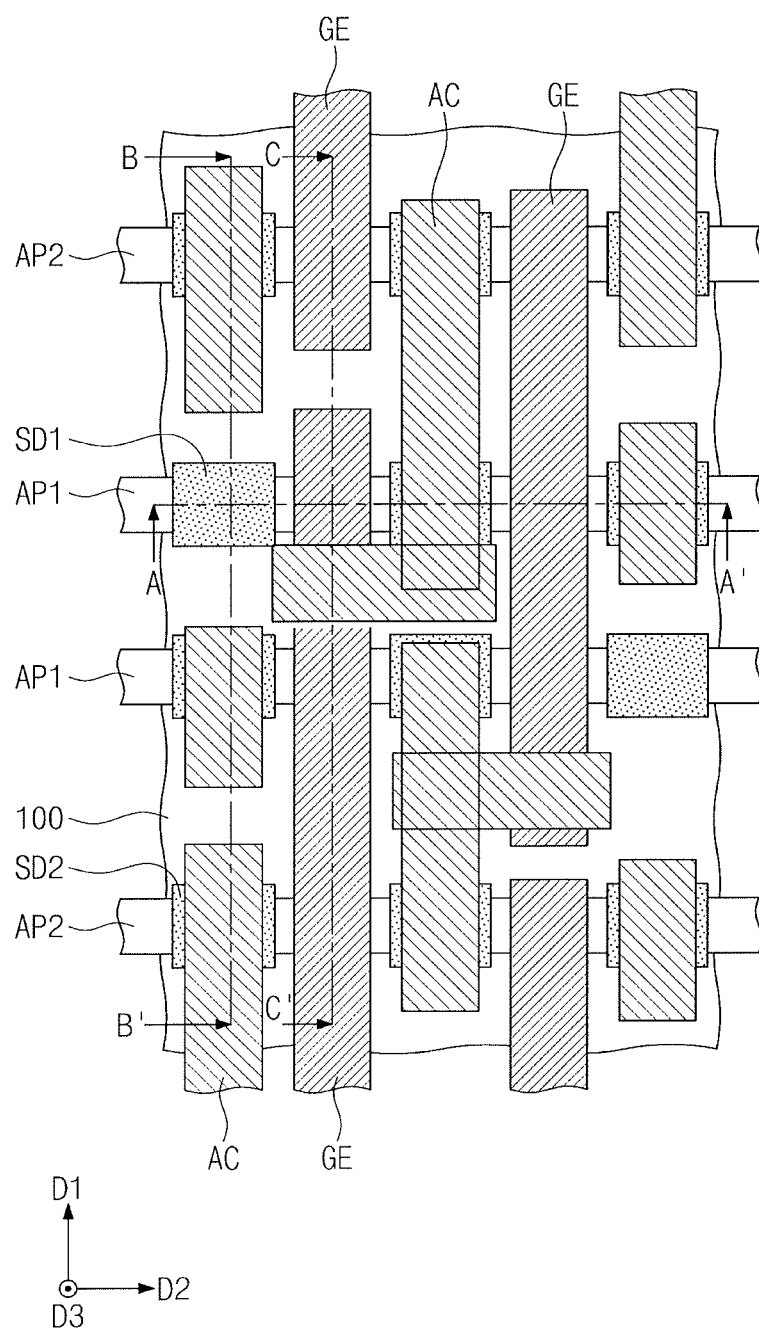

FIG. 20
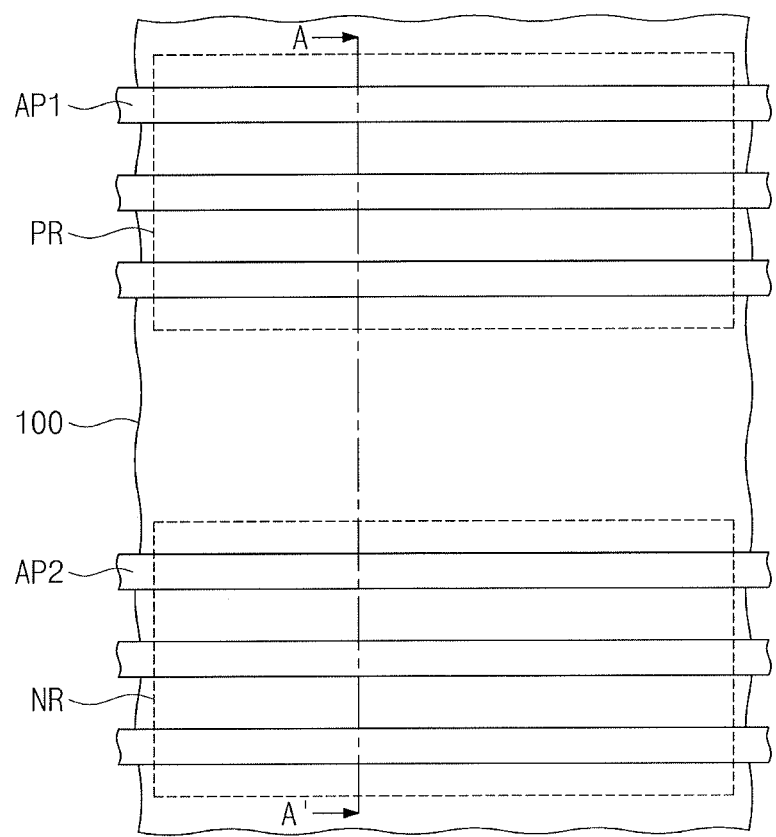
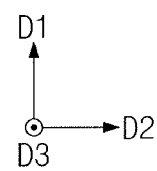

SEMICONDUCTOR DEVICE HAVING INCREASED CONTACT AREA BETWEEN A SOURCE/DRAIN PATTERN AND AN ACTIVE CONTACT

CROSS-REFERENCE TO RELATED APPLICATIONS

This is a continuation application based on pending application Ser. No. 16/452,668, filed Jun. 26, 2019, the entire contents of which is hereby incorporated by reference.

Korean Patent Application No. 10-2018-0082280 filed on Jul. 16, 2018, in the Korean Intellectual Property Office, and entitled: "Semiconductor Device," is incorporated by reference herein in its entirety.

BACKGROUND

1. Field

Embodiments relate to a semiconductor device.

2. Description of the Related Art

Semiconductor devices are beneficial in the electronics industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements.

SUMMARY

The embodiments may be realized by providing a semiconductor device including a substrate including an active pattern; a gate electrode running across the active pattern; a source/drain pattern adjacent to one side of the gate electrode and on an upper portion of the active pattern; an active contact electrically connected to the source/drain pattern; and a silicide layer between the source/drain pattern and the active contact, wherein the source/drain pattern includes a body part including a plurality of semiconductor patterns; and a capping pattern on the body part, wherein the body part has a first facet, a second facet on the first facet, and a corner edge defined where the first facet meets the second facet, the corner edge extending parallel to the substrate, wherein the capping pattern covers the second facet of the body part and exposes the corner edge, and wherein the silicide layer covers a top surface of the body part and a top surface of the capping pattern.

The embodiments may be realized by providing a semiconductor device including a substrate including an active pattern; a gate electrode running across the active pattern and extending in a first direction; and a source/drain pattern adjacent to one side of the gate electrode and on an upper portion of the active pattern, wherein the source/drain pattern includes a body part including a plurality of semiconductor patterns; and a capping pattern on the body part, wherein the body part has a first semiconductor pattern that is an outermost one of the plurality of semiconductor patterns, the first semiconductor pattern including silicon in an amount of about 95 at % to about 100 at %, wherein the capping pattern includes germanium, a germanium content of the capping pattern being about 5 at % to about 100 at %, wherein the capping pattern covers one facet of the first semiconductor pattern and exposes a corner edge of the body part, and wherein the source/drain pattern has a maximum width in the first direction at a level at which the corner edge is located.

The embodiments may be realized by providing a semiconductor device including a substrate including an active pattern; a gate electrode running across the active pattern and extending in a first direction; and a source/drain pattern adjacent to one side of the gate electrode and on an upper portion of the active pattern, wherein the source/drain pattern includes a body part including a plurality of semiconductor patterns; and a capping pattern on the body part, wherein the body part includes a corner edge that horizontally protrudes in the first direction, wherein the capping pattern exposes the corner edge of the body part, and wherein a germanium content of the capping pattern is greater than a germanium content of the body part.

BRIEF DESCRIPTION OF THE DRAWINGS

Features will be apparent to those of skill in the art by describing in detail exemplary embodiments with reference to the attached drawings in which:

FIG. 1 illustrates a plan view of a semiconductor device according to some example embodiments.

FIGS. 20, 22, 24, 26, and 28 illustrate plan views of stages in a method of manufacturing a semiconductor device according to some example embodiments.

DETAILED DESCRIPTION

Figure 2A:
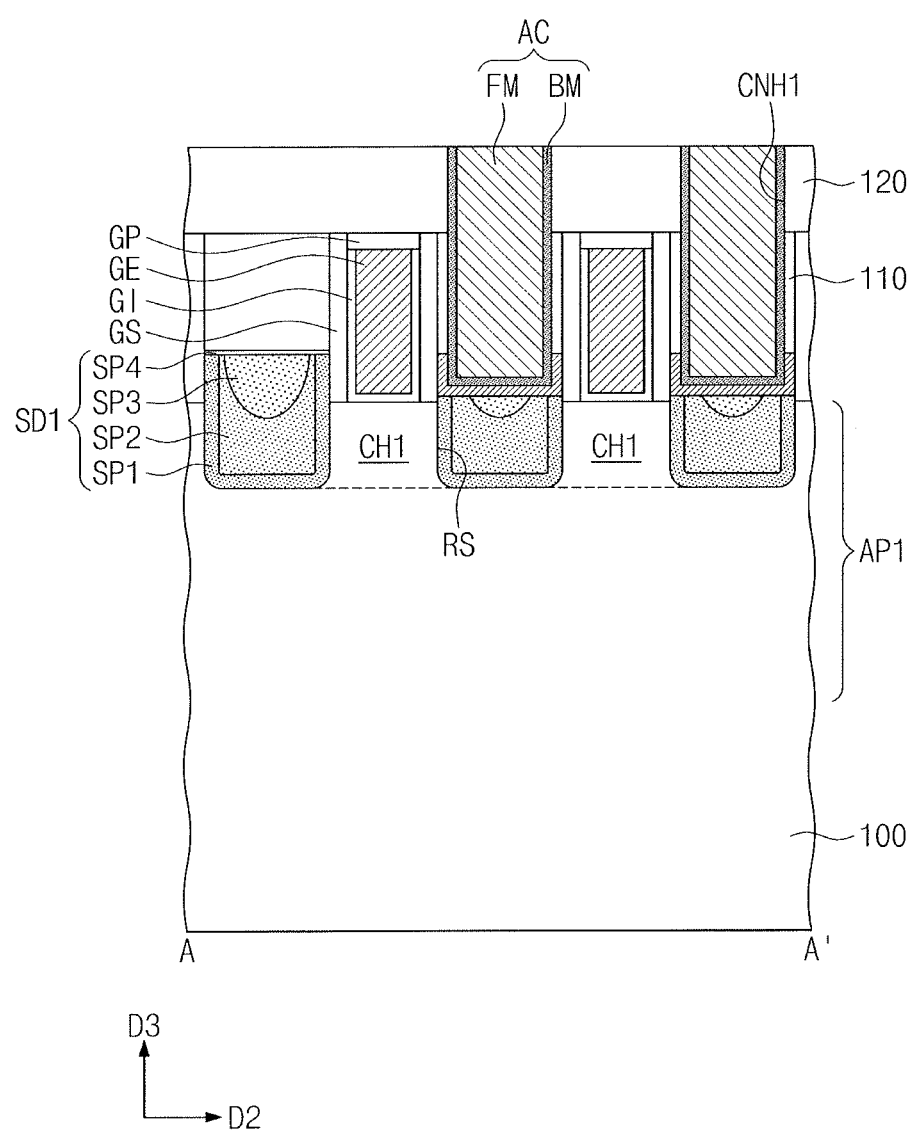
FIGS. 2A, 2B, and 2C illustrate cross-sectional views respectively taken along lines A-A', B-B', and C-C' of FIG. 1.
Figure 2B:
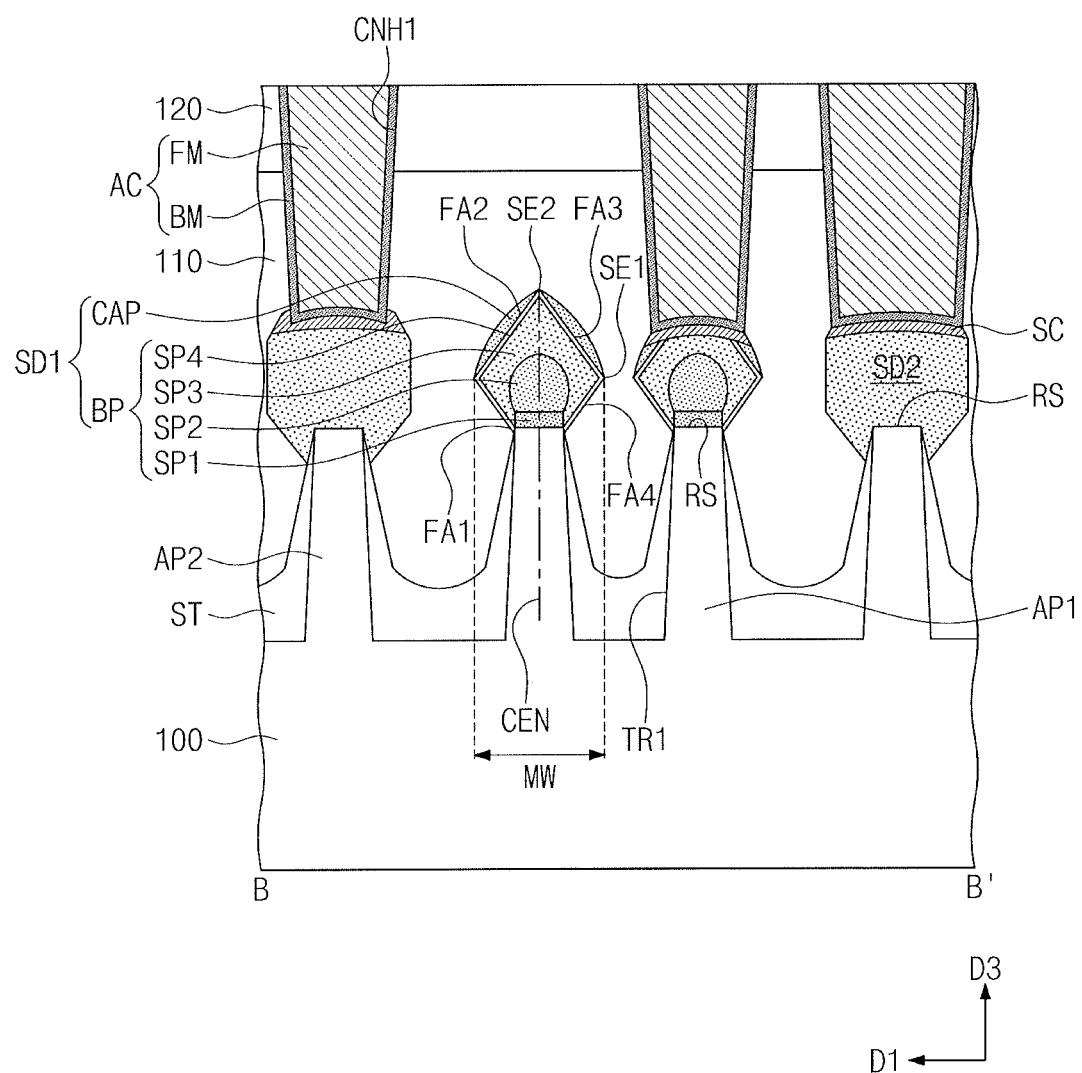
Figure 2C:
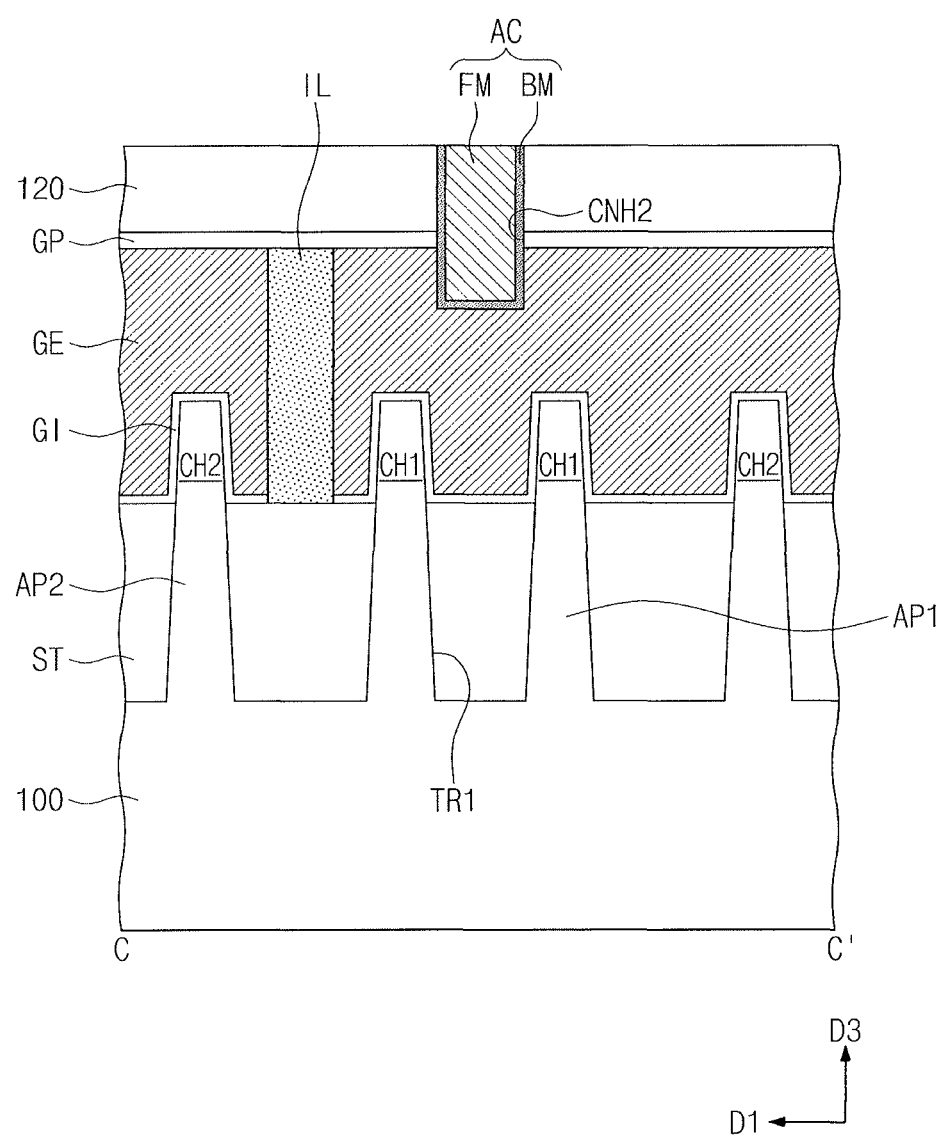

FIG. 1 illustrates a plan view of a semiconductor device according to some example embodiments. FIGS. 2A, 2B, and 2C illustrate cross-sectional views respectively taken along lines A-A', B-B', and C-C' of FIG. 1.

Referring to FIGS. 1 and 2A to 2C, a substrate 100 may be provided to include a memory cell region. For example, the memory cell region of the substrate 100 may be provided thereon with memory cell transistors that constitute a plurality of SRAM cells.

A device isolation layer ST may be provided on the substrate 100. The device isolation layer ST may define first and second active patterns AP1 and AP2. The substrate 100 may include a compound semiconductor substrate or a semiconductor substrate including silicon, germanium, silicon-germanium, or the like. The device isolation layer ST may include a dielectric material, such as a silicon oxide layer.

The first and second active patterns AP1 and AP2 may be portions of the substrate 100. The first and second active patterns AP1 and AP2 may extend in parallel along a second direction D2. A first trench TR1 may be defined between a pair of neighboring active patterns AP1 and AP2. The device isolation layer ST may (e.g., at least partially) fill the first trench TR1. The first and second active patterns AP1 and AP2 may have their upper portions that vertically protrude beyond the device isolation layer ST. Each of the upper portions of the first and second active patterns AP1 and AP2 may have a fin shape that vertically protrudes above the device isolation layer ST.

First channels CH1 and first source/drain patterns SD1 may be provided on the upper portion of each of the first active patterns AP1. For example, the first source/drain pattern SD1 may fill a recess RS formed on the upper portion of the first active pattern AP1. Second channels CH2 and second source/drain patterns SD2 may be provided on the upper portion of each of the second active patterns AP2. The first source/drain patterns SD1 may be p-type impurity regions. The second source/drain patterns SD2 may be n-type impurity regions. Each of the first channels CH1 may be between a pair of the first source/drain patterns SD1, and each of the second channels CH2 may be between a pair of the second source/drain patterns SD2.

The first and second source/drain patterns SD1 and SD2 may be epitaxial patterns formed by a selective epitaxial growth process. The first and second source/drain patterns SD1 and SD2 may have their top surfaces at a higher level (e.g., farther from the substrate 100) than that of top surfaces of the first and second channels CH1 and CH2. The first and second source/drain patterns SD1 and SD2 may include a semiconductor element that is the same as or different from that of the substrate 100. The first source/drain patterns SD1 may include a semiconductor element whose lattice constant is greater than that of the semiconductor element of the substrate 100. The first source/drain patterns SD1 may therefore provide the first channel region CH1 with compressive stress. The first source/drain patterns SD1 may include, e.g., silicon-germanium (SiGe). The second source/drain patterns SD2 may include the same semiconductor element as that of the substrate 100. The second source/drain pattern SD2 may include, e.g., silicon (Si).

Gate electrodes GE may be provided to extend in a first direction D1, while running across the first and second active patterns AP1 and AP2. The gate electrodes GE may vertically overlap the first and second channels CH1 and CH2. For example, the gate electrodes GE may include one or more of conductive metal nitride (e.g., titanium nitride or tantalum nitride) and metal (e.g., titanium, tantalum, tungsten, copper, or aluminum).

A dielectric pattern IL may be between the gate electrodes GE adjacent to each other in the first direction D1. The dielectric pattern IL may separate adjacent gate electrodes GE from each other.

A pair of gate spacers GS may be on opposite sidewalls of each of the gate electrodes GE. The gate spacers GS may extend in the first direction D1 along the gate electrodes GE. The gate spacers GS may have top surfaces that are higher than those of the gate electrodes GE. The top surfaces of the gate spacers GS may be coplanar with that of a first interlayer dielectric layer 110, which will be discussed below. The gate spacers GS may include one or more of $SiO_2$, SiCN, SiCON, and SiN. In an implementation, the gate spacers GS may include a multiple layer that consists of two or more of $SiO_2$, SiCN, SiCON, and SiN.

Gate dielectric patterns GI may be between the gate electrode GE and the first active pattern AP1 and between the gate electrode GE and the second active pattern AP2. Each of the gate dielectric patterns GI may extend along a bottom surface of one of the gate electrode GE. Each of the gate dielectric patterns GI may cover the top surface and opposite sidewalls of one of the first and second channels CH1 and CH2. The gate dielectric patterns GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate capping pattern GP may be provided on each of the gate electrodes GE. The gate capping patterns GP may extend in the first direction D1 along the gate electrodes GE. The gate capping pattern GP may be between a pair of the gate spacers GS. The gate capping patterns GP may include a material having an etch selectivity with respect to first, second, third, and fourth interlayer dielectric layers 110, 120, 130, and 140, which will be discussed below. For example, the gate capping patterns GP may include one or more of SiON, SiCN, SiCON, and SiN.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface that is substantially coplanar with those of the gate capping patterns GP and those of the gate spacers GS. The first interlayer dielectric layer 110 may be provided thereon with a second interlayer dielectric layer 120 that covers the top surfaces of the gate capping patterns GP and the top surfaces of the gate spacers GS.

Active contacts AC may be provided between the gate electrodes GE. The active contacts AC may penetrate the second interlayer dielectric layer 120 and the first interlayer dielectric layer 110, and may then be coupled to the first and second source/drain patterns SD1 and SD2. The active contacts AC may have top surfaces coplanar with that of the second interlayer dielectric layer 120.

Each of the active contacts AC may include a conductive pattern FM and a barrier pattern BM surrounding the conductive pattern FM. The barrier pattern BM may cover sidewalls and a bottom surface of the conductive pattern FM. The conductive pattern FM may include metal, e.g., one or more of aluminum, copper, tungsten, molybdenum, and cobalt. The barrier pattern BM may include a metal layer and a metal nitride layer. The metal layer may include one or more of titanium, tantalum, tungsten, nickel, cobalt, and platinum. The metal nitride layer may include one or more of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A silicide layer SC may be between each of the first and second source/drain patterns SD1 and SD2 and the active contact AC corresponding to the each of the first and second source/drain patterns SD1 and SD2. The active contact AC may be electrically connected through the silicide layer SC either to the first source/drain pattern SD1 or to the second source/drain pattern SD2. The silicide layer SC may include metal silicide, e.g., one or more of titanium silicide, tantalum silicide, tungsten silicide, nickel silicide, and cobalt silicide.

Gate contacts GC may be provided on the gate electrodes GE. Each of the gate contacts GC may be coupled to the gate electrode GE, while penetrating the second interlayer dielectric layer 120, the first interlayer dielectric layer 110, and the gate capping pattern GP. The gate contacts GC may have top surfaces coplanar with that of the second interlayer dielectric layer 120. The gate contacts GC may have bottom surfaces higher than those of the active contacts AC.

Each of the gate contacts GC may include a conductive pattern FM and a barrier pattern BM surrounding the conductive pattern FM. The conductive pattern FM and the barrier pattern BM of the gate contact CG may be substantially the same respectively as the conductive pattern FM and the barrier pattern BM of the active contact AC discussed above. For example, the gate contact GC and its connected active contact AC may constitute a single conductive structure.

The first source/drain pattern SD1 will be further discussed in detail with reference back to FIGS. 2A and 2B. The first source/drain pattern SD1 may include a body part BP and a capping pattern CAP on the body pat BP. The body part BP may include a first semiconductor pattern SP1, a second semiconductor pattern SP2, a third semiconductor pattern SP3, and a fourth semiconductor pattern SP4.

The first semiconductor pattern SP1 may cover an inner wall of the recess RS. The first semiconductor pattern SP1 may have a U shape when viewed in cross-section taken along the second direction D2 (see FIG. 2A). For example, the first semiconductor pattern SP1 may be conformally formed to have a uniform thickness on the inner wall of the recess RS.

The first semiconductor pattern SP1 may be provided thereon with the second semiconductor pattern SP2 that covers an inner wall of the first semiconductor pattern SP1. The second semiconductor pattern SP2 may have a U shape when viewed in cross-section taken along the second direction D2.

The second semiconductor pattern SP2 may be provided thereon with the third semiconductor pattern SP3 that covers an inner wall of the second semiconductor pattern SP2. The second semiconductor pattern SP2 may be between the first semiconductor pattern SP1 and the third semiconductor pattern SP3. The first, second, and third semiconductor patterns SP1, SP2, and SP3 may completely fill the recess RS.

Each of the first, second, and third semiconductor patterns SP1, SP2, and SP3 may include a semiconductor element whose lattice constant is greater than that of a semiconductor element included in the substrate 100. For example, when the substrate 100 includes silicon (Si), the first, second, and third semiconductor patterns SP1, SP2, and SP3 may include silicon-germanium (SiGe). Germanium (Ge) may have a greater lattice constant than that of silicon (Si).

The first semiconductor pattern SP1 may serve as a buffer layer between the substrate 100 and the second semiconductor pattern SP2. The first semiconductor pattern SP1 may contain germanium (Ge) whose concentration is relatively low. For example, the first semiconductor pattern SP1 may contain germanium (Ge) in an amount of about 10 at % to about 30 at %. The second semiconductor pattern SP2 may contain germanium (Ge) in an amount that is greater than that of germanium (Ge) contained in the first semiconductor pattern SP1. For example, the second semiconductor pattern SP2 may have a germanium (Ge) content of about 25 at % to about 50 at %. The third semiconductor pattern SP3 may contain germanium (Ge) in an amount that is greater than that of germanium (Ge) contained in the second semiconductor pattern SP2. For example, the third semiconductor pattern SP3 may have a germanium (Ge) content of about 40 at % to about 75 at %.

The first, second, and third semiconductor patterns SP1, SP2, and SP3 may include impurities (e.g., boron) that cause the first source/drain pattern SD1 to have p-type conductivity. The third semiconductor pattern SP3 may have an impurity concentration (e.g., at %) that is greater than that of the second semiconductor pattern SP2. The impurity concentration of the second semiconductor pattern SP2 may be greater than that of the first semiconductor pattern SP1.

The fourth semiconductor pattern SP4 may be provided on the third semiconductor pattern SP3. The fourth semiconductor pattern SP4 may cover an exposed surface of the third semiconductor pattern SP3. The fourth semiconductor pattern SP4 may act as a capping layer that protects the third semiconductor pattern SP3. The fourth semiconductor pattern SP4 may include the same semiconductor element as that of the substrate 100. For example, the fourth semiconductor pattern SP4 may include single crystalline silicon (Si). The fourth semiconductor pattern SP4 may include silicon (Si) in an amount of about 95 at % to about 100 at %.

The following will discuss a cross-section in the first direction D1 of the first source/drain pattern SD1 with reference back to FIG. 2B. The body part BP may include a first facet FA1, a second facet FA2, a third facet FA3, and a fourth facet FA4. The first to fourth facets FA1 to FA4 may be surfaces of the fourth semiconductor pattern SP4. The first to fourth facets FA1 to FA4 may be substantially the same crystal plane. The first to fourth facets FA1 to FA4 may be (111) planes.

A first corner edge SE1 may be defined by (e.g., formed at an interface between) the first and second facets FA1 and FA2 or by the third and fourth facets FA3 and FA4. The first corner edge SE1 may horizontally protrude in a direction away from a central line CEN of the first active pattern AP1. For example, the first corner edge SE1 may protrude in the first direction D1 or in a reverse direction to the first direction D1.

A second corner edge SE2 may be defined by the second and third facets FA2 and FA3. The second corner edge SE2 may be aligned with the central line CEN of the first active pattern AP1. The second corner edge SE2 may vertically protrude along the central line CEN. For example, the second corner edge SE2 may protrude in a third direction D3.

The capping pattern CAP may be provided on the body part BP. The capping pattern CAP may selectively cover the second and third facets FA2 and FA3 of the body part BP. The capping pattern CAP may not cover the first and second corner edges SE1 and SE2 of the body part BP. The capping pattern CAP may expose the first and second corner edges SE1 and SE2 of the body part BP. The first and fourth facets FA1 and FA4 of the body part BP may not be covered with the capping pattern CAP, and may be exposed.

The capping pattern CAP may have a rounded surface. The capping pattern CAP may have a thickness that increases and then decreases approaching the second corner edge SE2 from the first corner edge SE1. The capping pattern CAP may include germanium (Ge) or silicon-germanium (SiGe). The capping pattern CAP may contain germanium (Ge) in an amount that is greater than that of germanium (Ge) in the third semiconductor pattern SP3. The capping pattern CAP may have a germanium (Ge) content of about 5 at % to about 100 at %. In an implementation, the germanium (Ge) content of the capping pattern CAP may be about 95 at % to about 100 at %.

The first source/drain pattern SD1 may have a maximum width MW in the first direction D1 at a level at which the first corner edge SE1 of the body part BP is located. The maximum width MW of the first source/drain pattern SD1 may be substantially the same as that of the body part BP. This may be because that the capping pattern CAP does not cover the first corner edge SE1 but selectively covers the second facet FA2 and the third facet FA3.

When the active contact AC is provided on the first source/drain pattern SD1, the capping pattern CAP may increase a contact area between the first source/drain pattern SD1 and the active contact AC (or the silicide layer SC). This may be because that the body part BP, the capping pattern CAP, and the active contact AC have therebetween a contact area greater than that between the body part BP and the active contact AC.

Because the first source/drain pattern SD1 maintains its maximum width MW even when the capping pattern CAP is additionally provided on the body part BP, a spacing margin may be securely obtained between the first source/drain patterns SD1 adjacent to each other. In such cases, an increase in contact area between the first source/drain pattern SD1 and the active contact AC may help improve electrical characteristics of a semiconductor device according to some example embodiments. Furthermore, an electrical short between neighboring first source/drain patterns SD1 may be reduced or prevented to enhance reliability of a semiconductor device according to some example embodiments.

FIGS. 3, 5, 7, 9, 11, and 13 illustrate plan views of stages in a method of manufacturing a semiconductor device according to some example embodiments. FIGS. 4, 6A, 8A, 10A, 12A, and 14A illustrate cross-sectional views taken along line A-A' of FIGS. 3, 5, 7, 9, 11, and 13, respectively. FIGS. 6B, 8B, 10B, 12B, and 14B illustrate cross-sectional views taken along line B-B' of FIGS. 5, 7, 9, 11, and 13, respectively. FIGS. 6C, 8C, 10C, 12C, and 14C illustrate cross-sectional views taken along line C-C' of FIGS. 5, 7, 9, 11, and 13, respectively.

Figure 3:
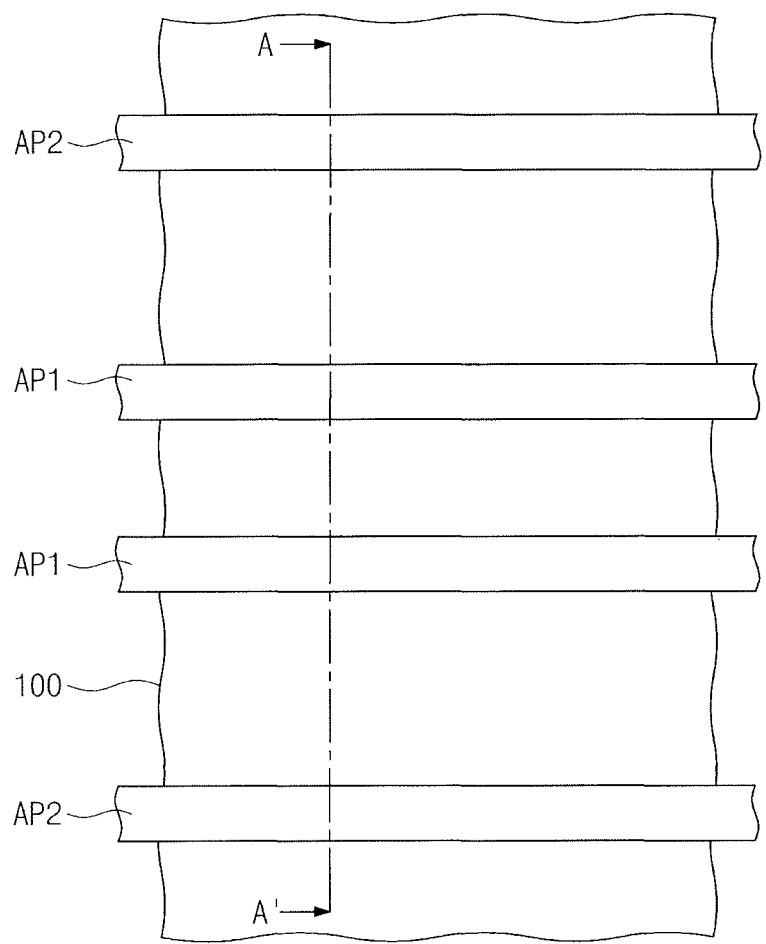
FIGS. 3, 5, 7, 9, 11, and 13 illustrate plan views of stages in a method of manufacturing a semiconductor device according to some example embodiments.
Figure 4:
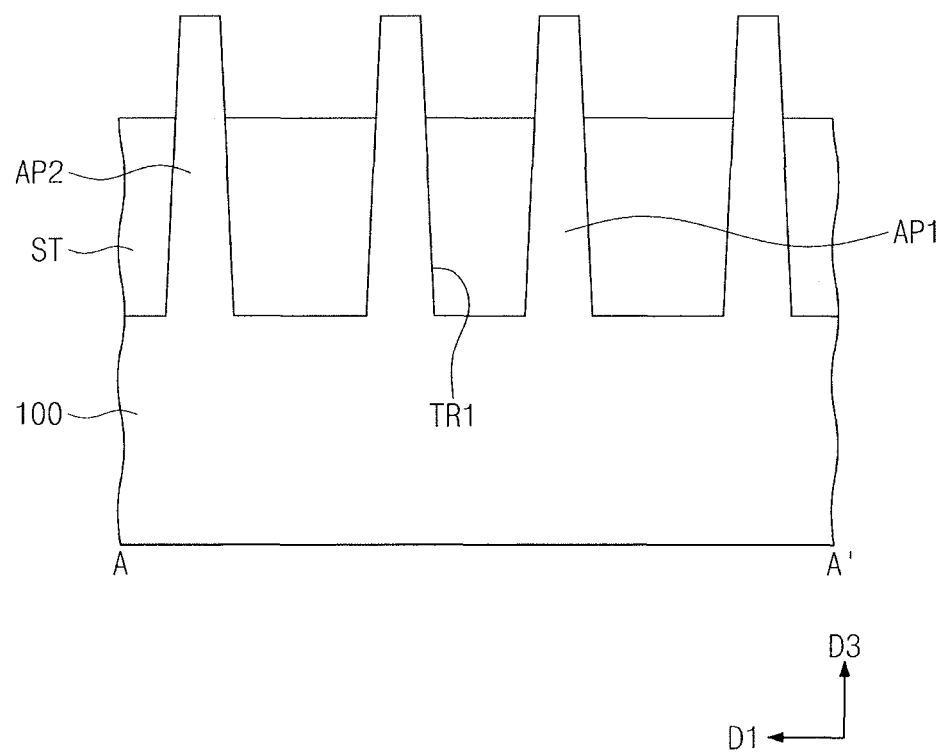
FIGS. 4, 6A, 8A, 10A, 12A, and 14A illustrate cross-sectional views taken along line A-A' of FIGS. 3, 5, 7, 9, 11, and 13, respectively.
Figure 5:
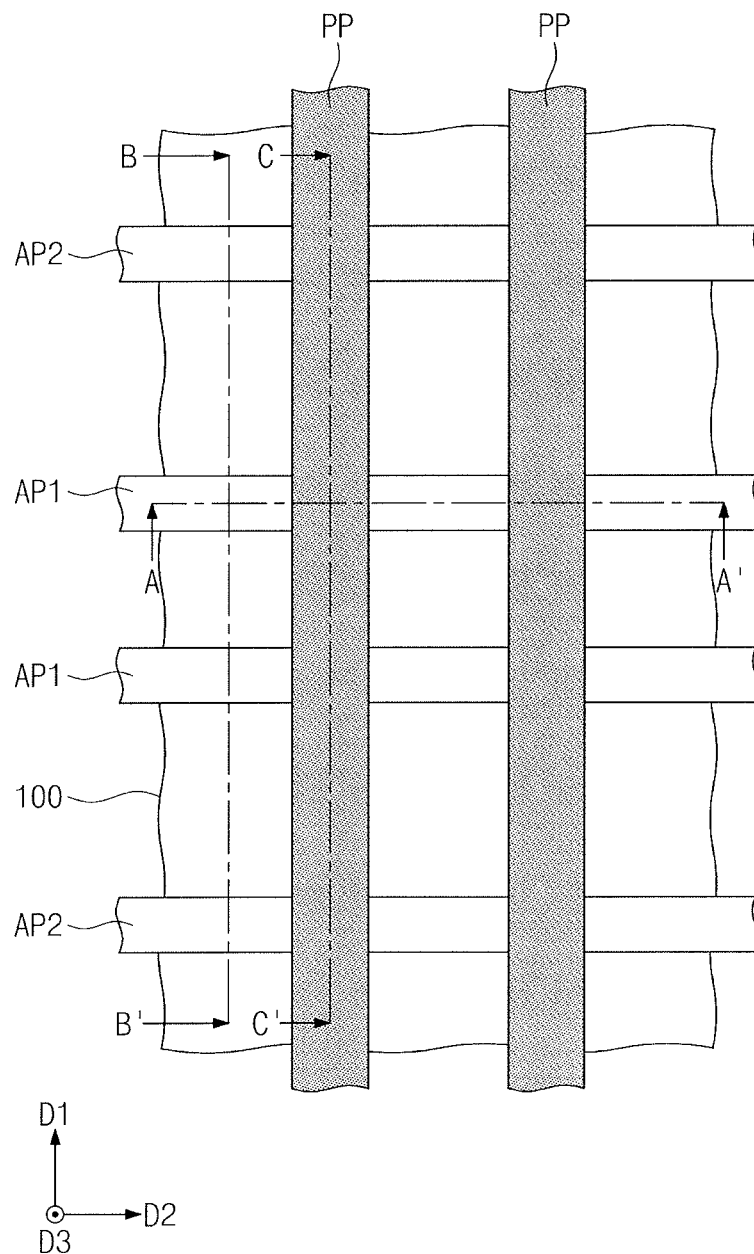
Figure 6A:
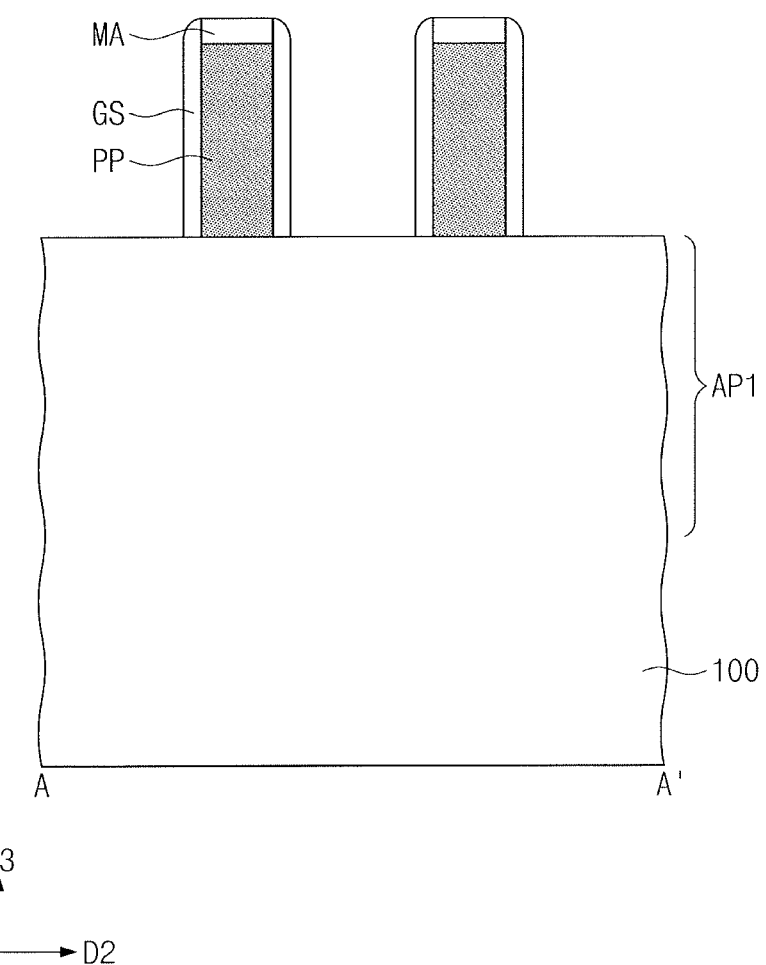
Figure 6B:
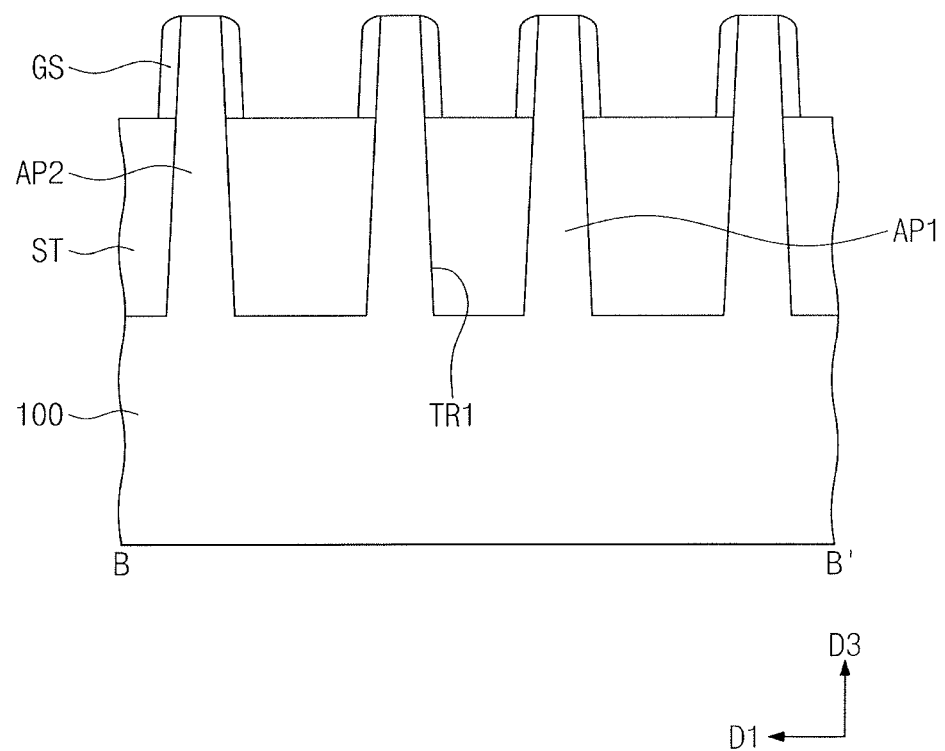
FIGS. 6B, 8B, 10B, 12B, and 14B illustrate cross-sectional views taken along line B-B' of FIGS. 5, 7, 9, 11, and 13, respectively.
Figure 6C:
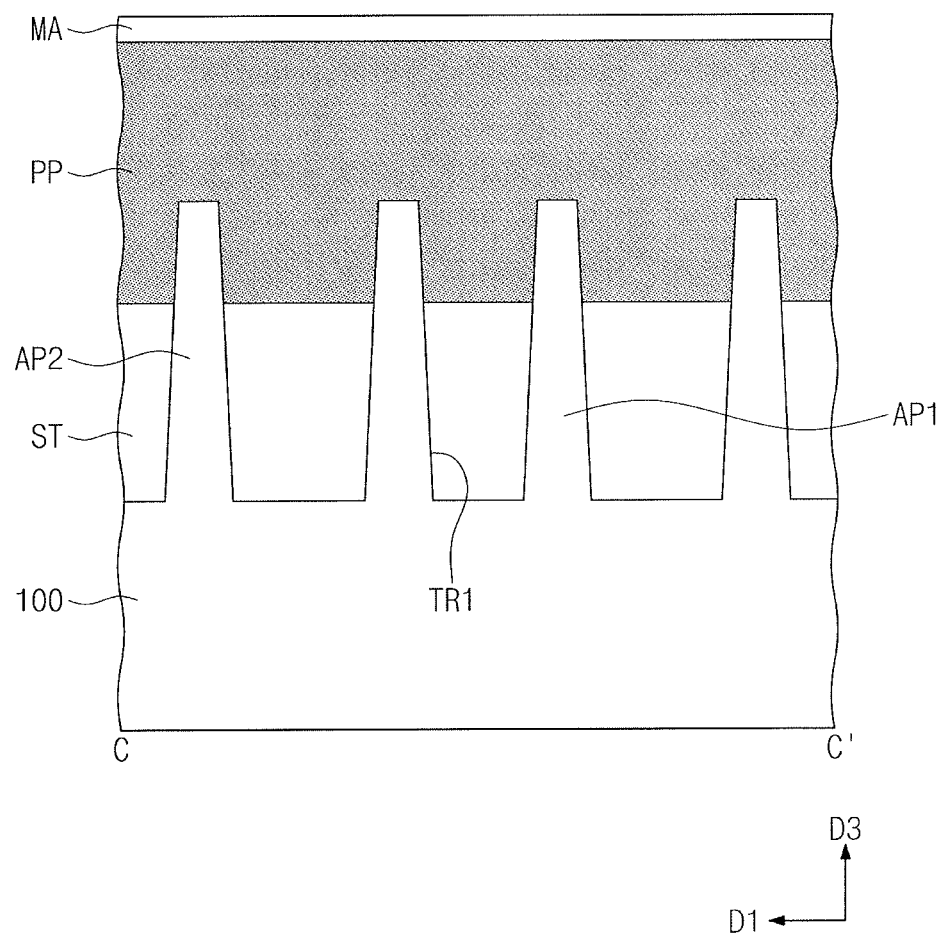
FIGS. 6C, 8C, 10C, 12C, and 14C illustrate cross-sectional views taken along line C-C' of FIGS. 5, 7, 9, 11, and 13, respectively.
Figure 7:
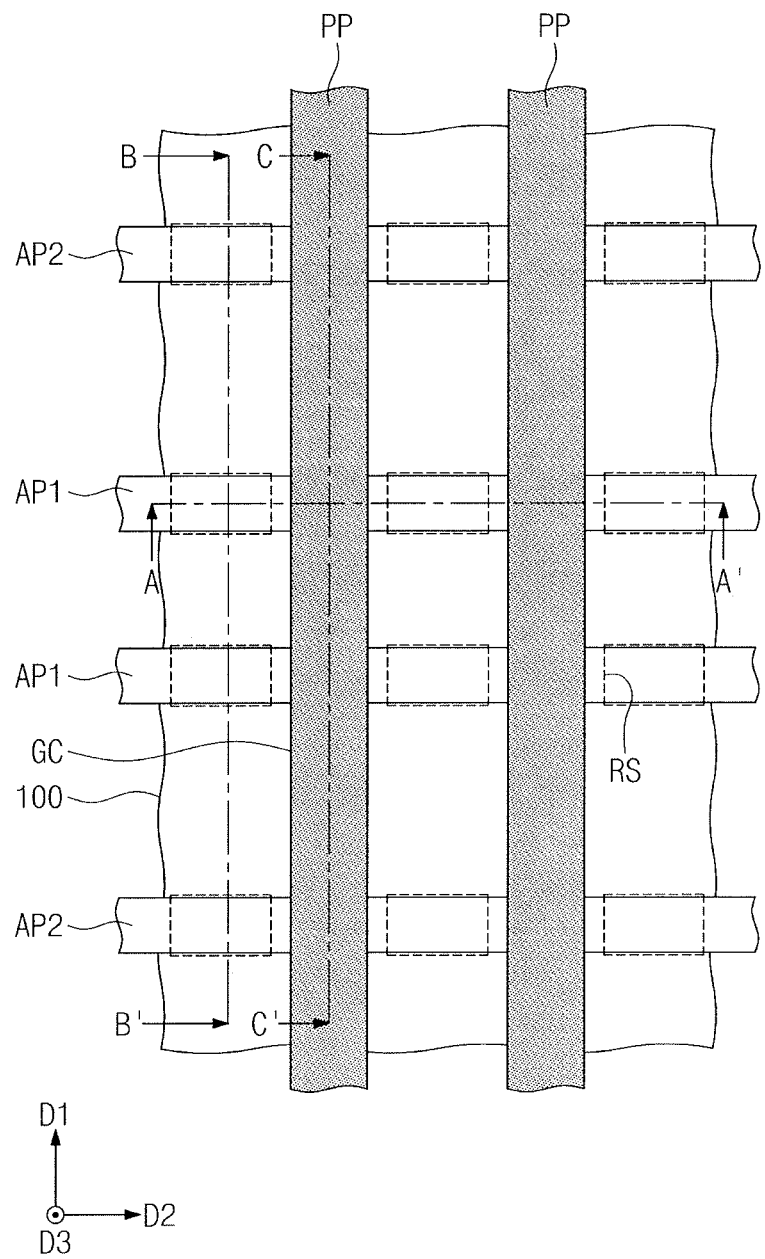
Figure 8A:
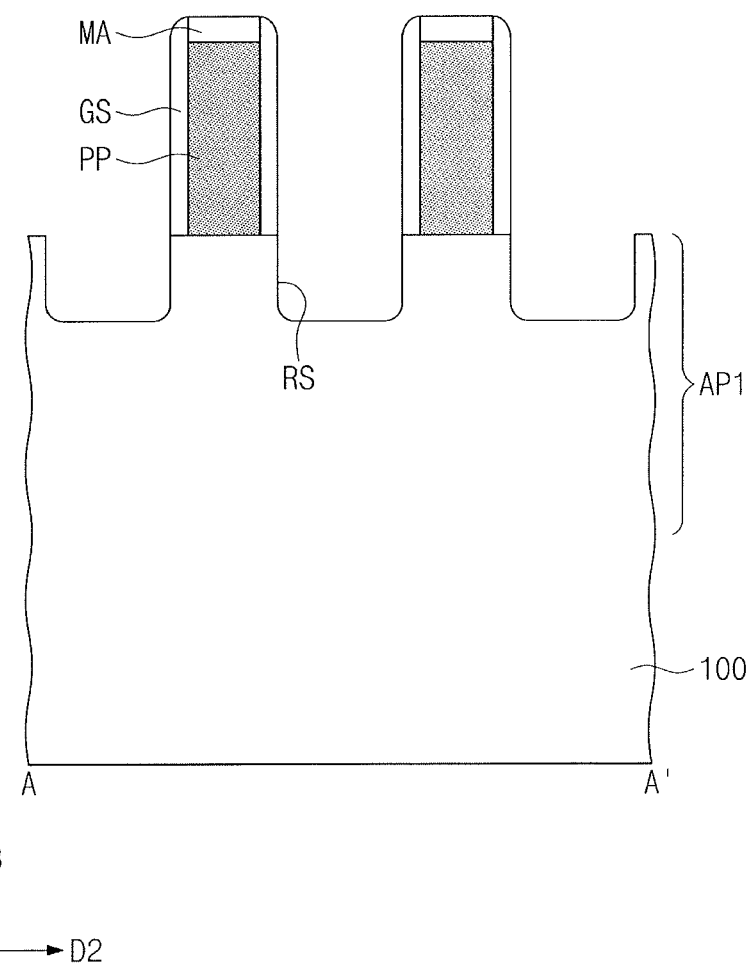
Figure 8B:
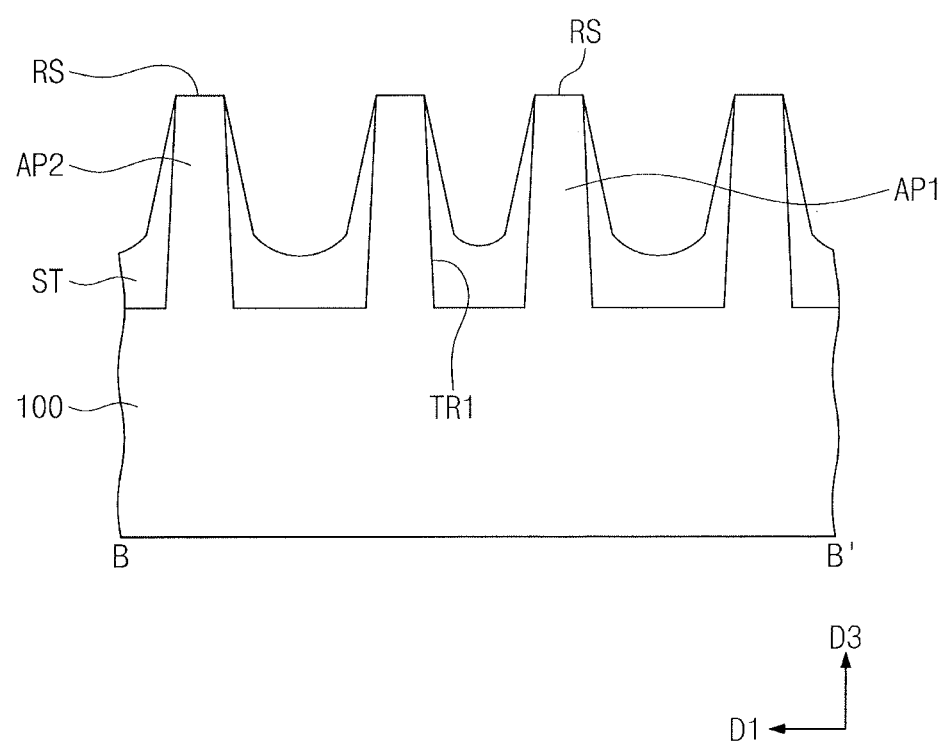
Figure 8C:
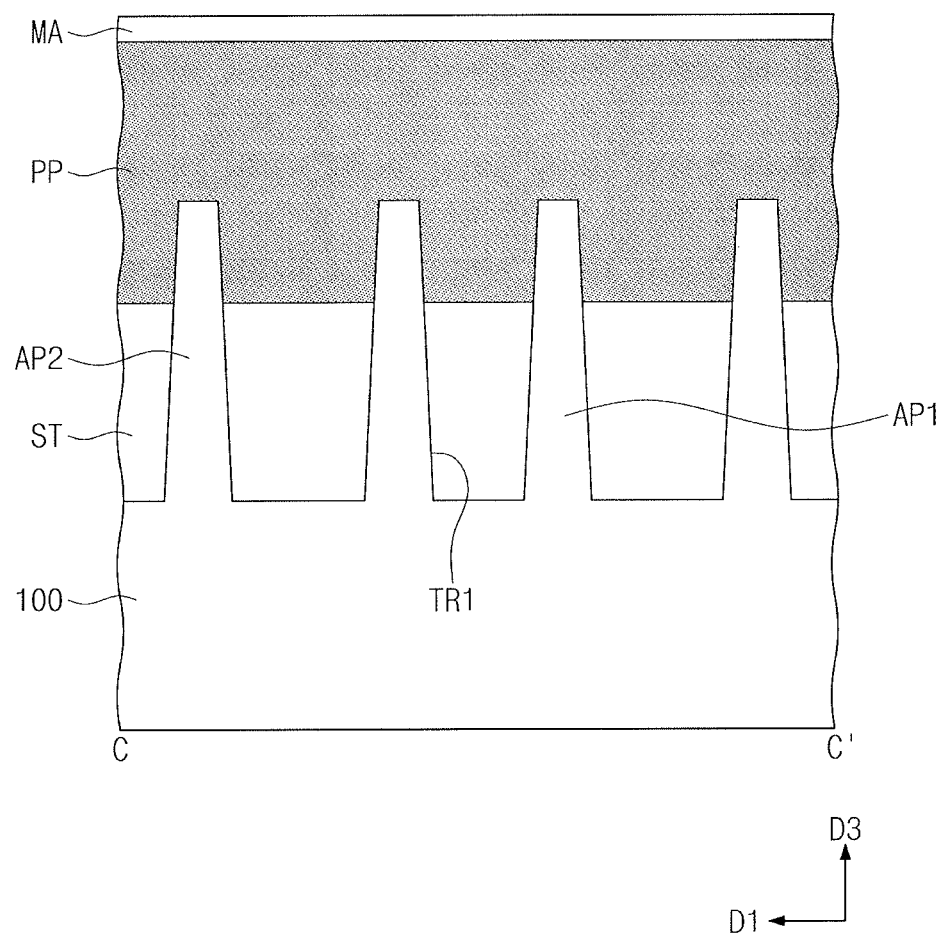
Figure 9:
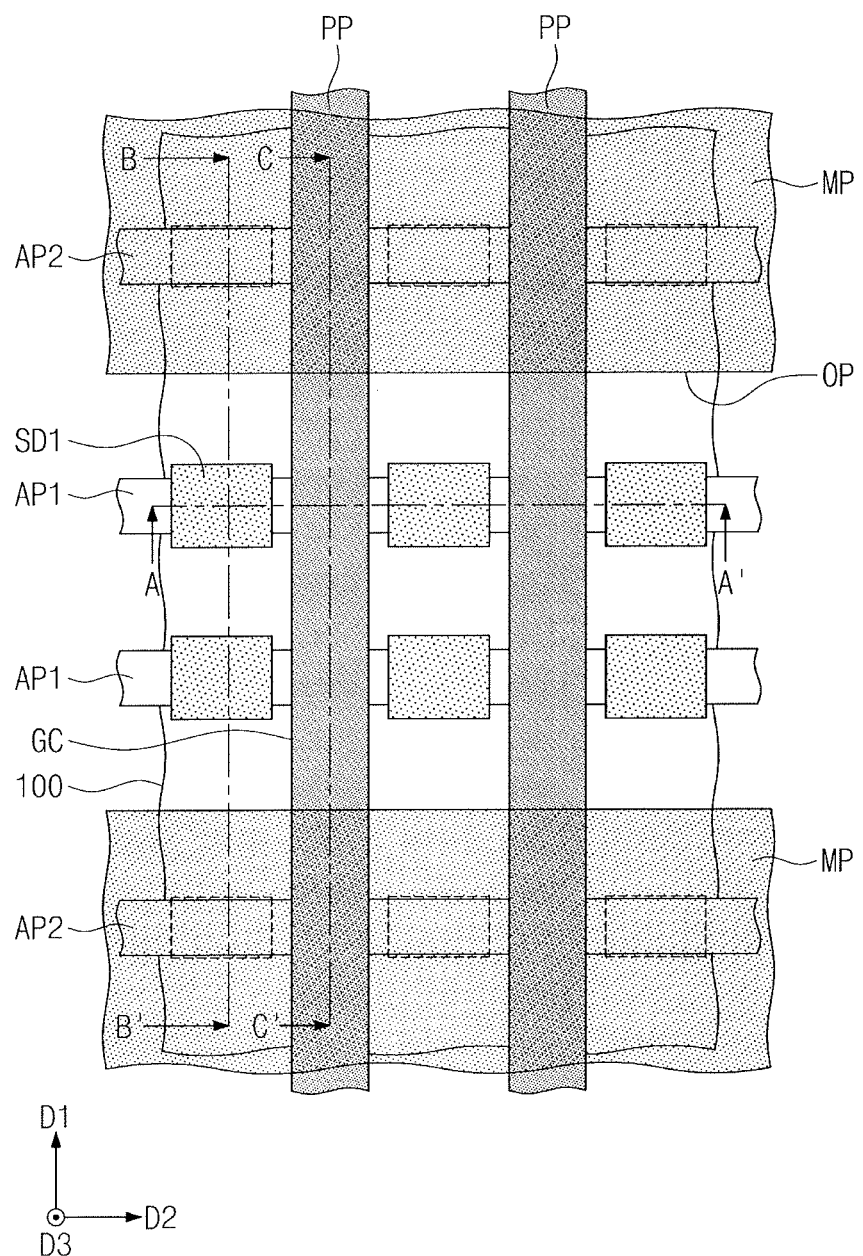
Figure 10A:
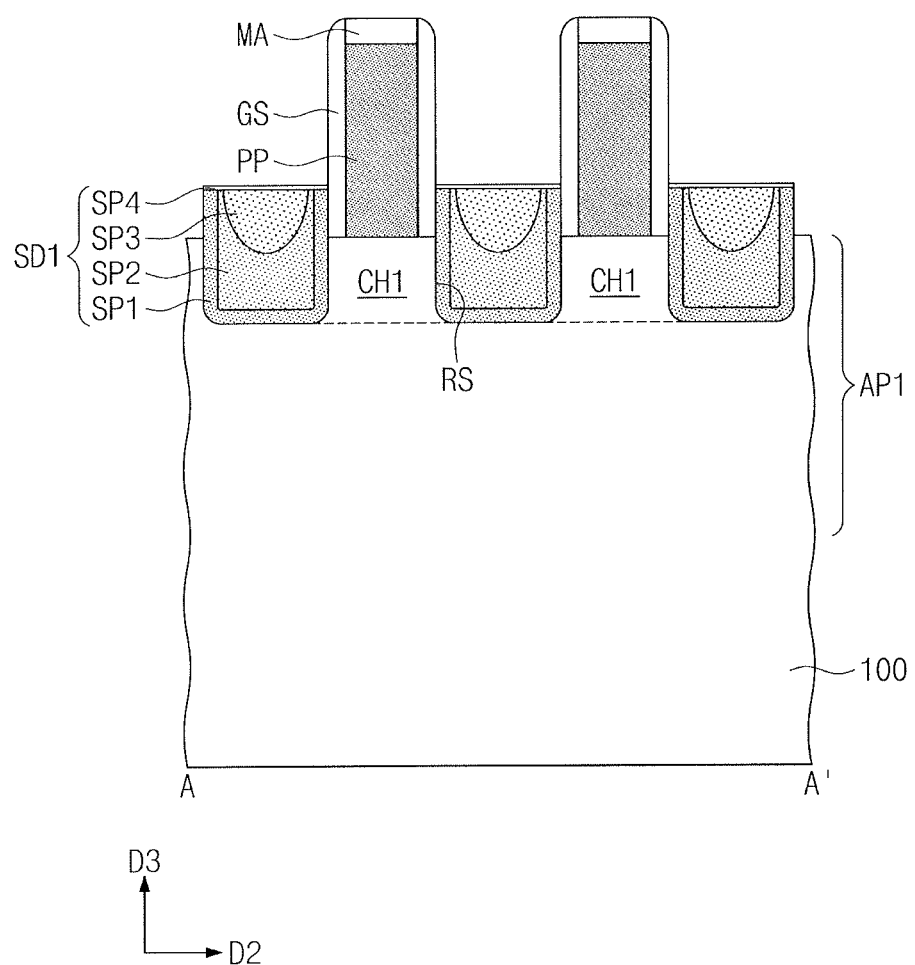
Figure 10B:
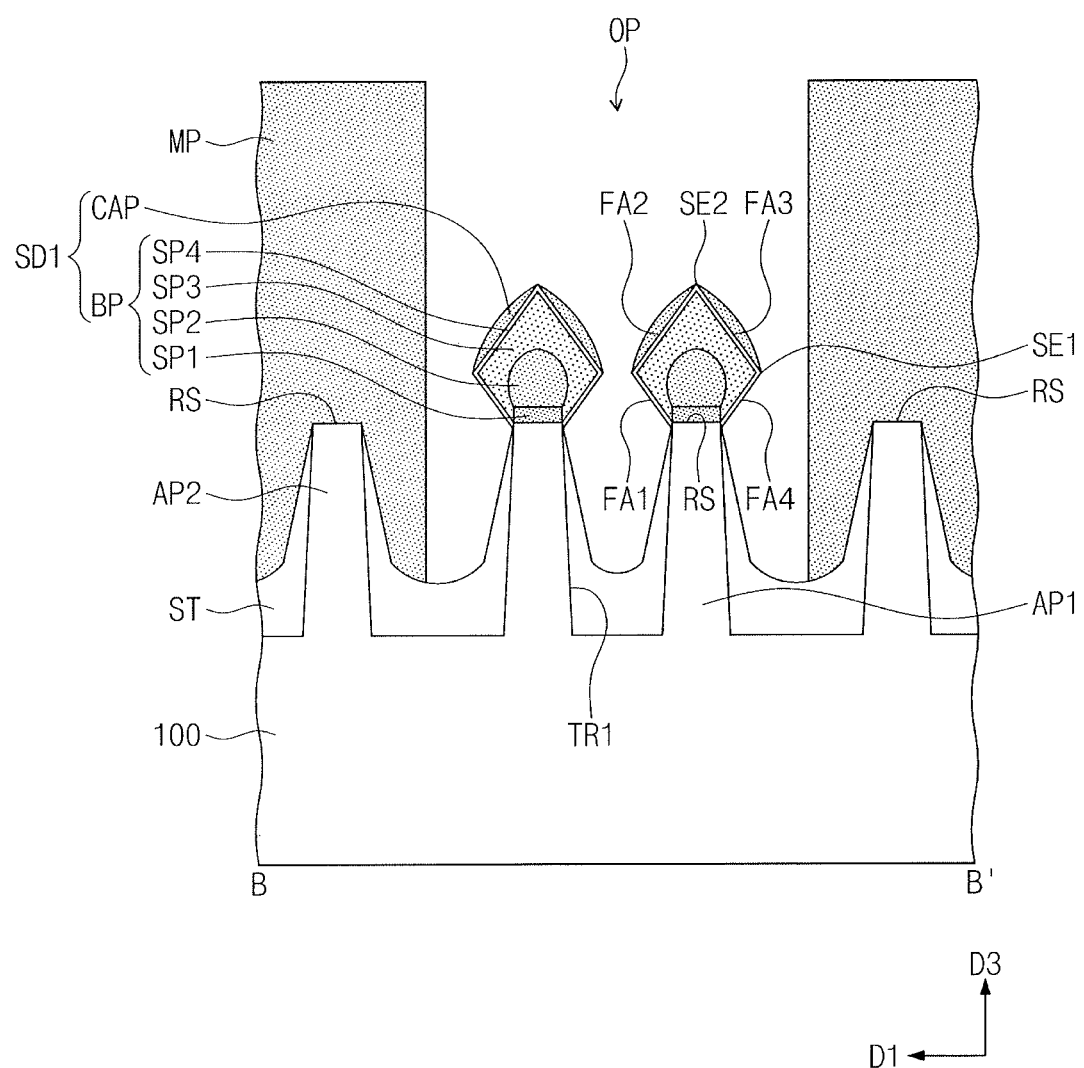
Figure 10C:
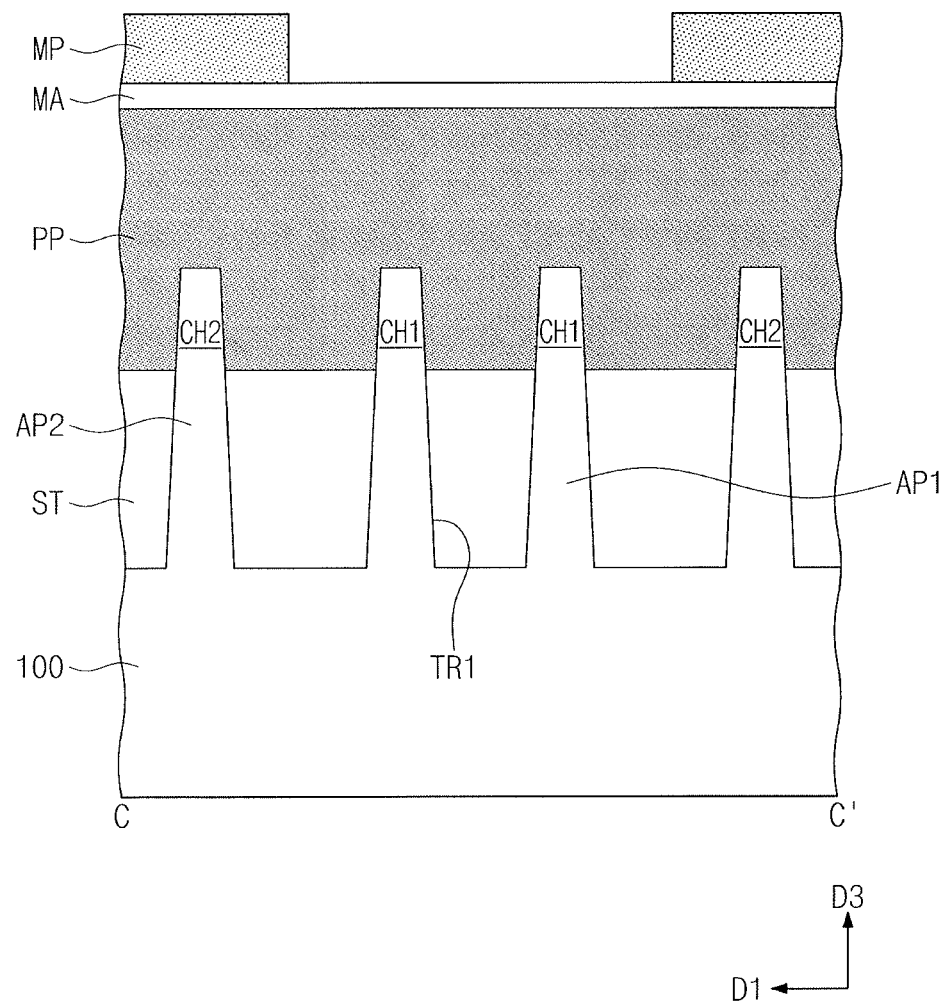
Figure 11:
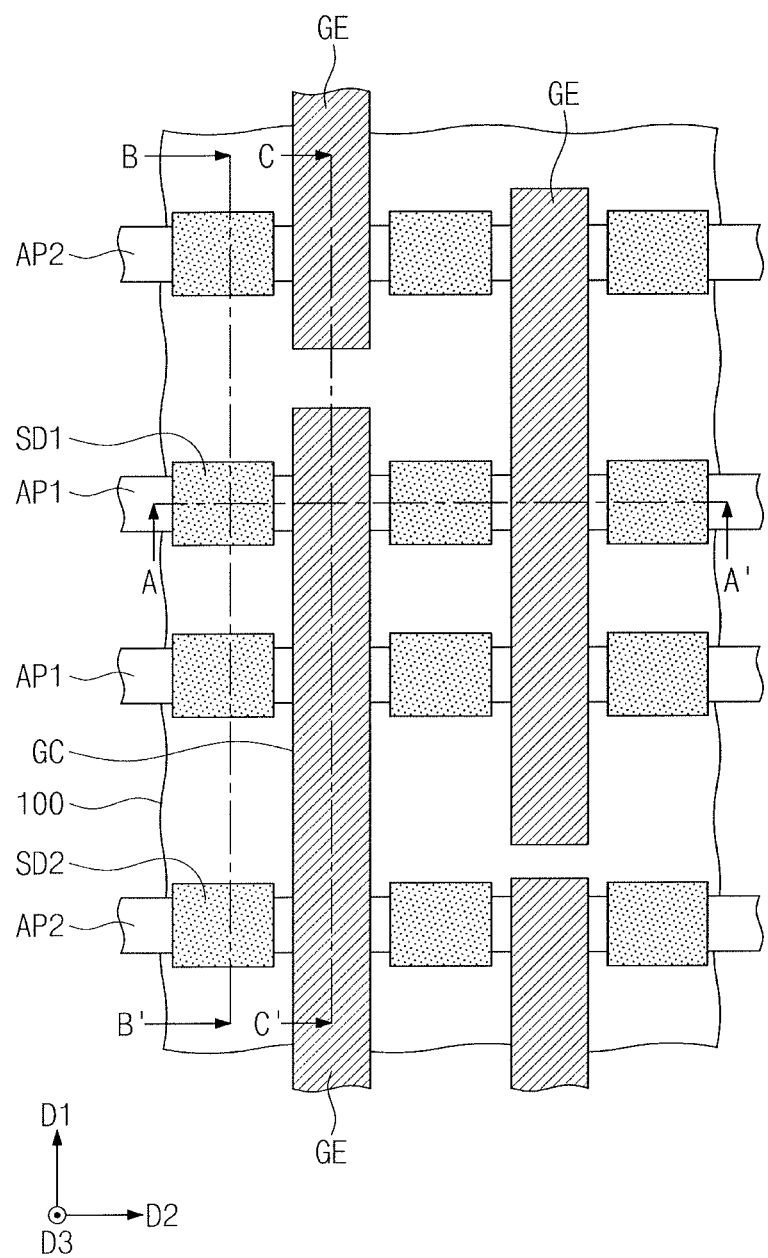
Figure 12A:
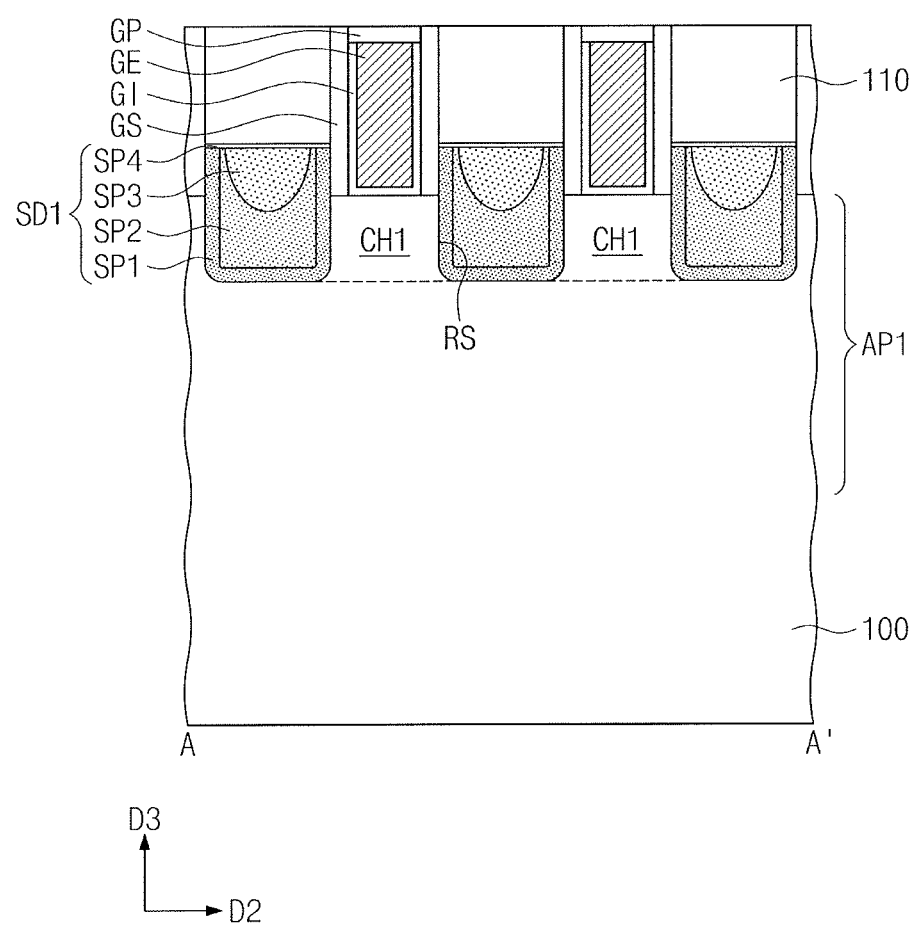
Figure 12B:
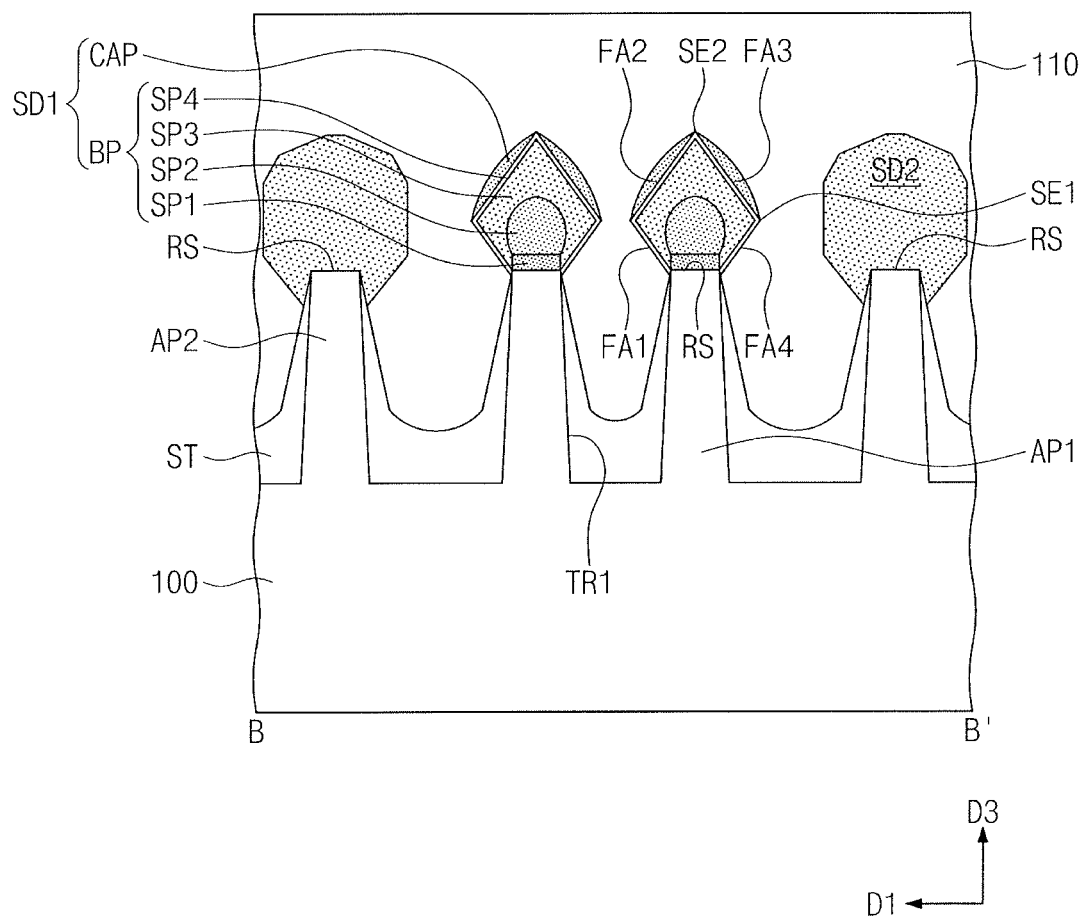
Figure 12C:
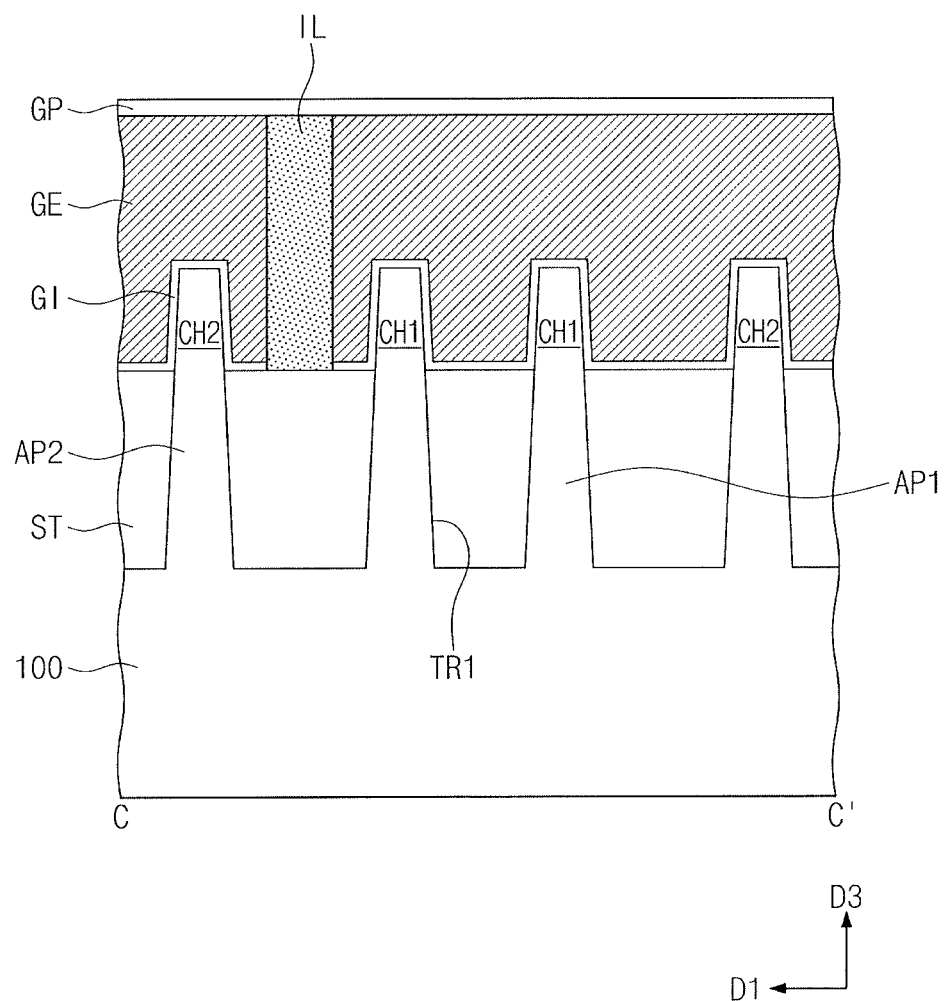
Figure 13:
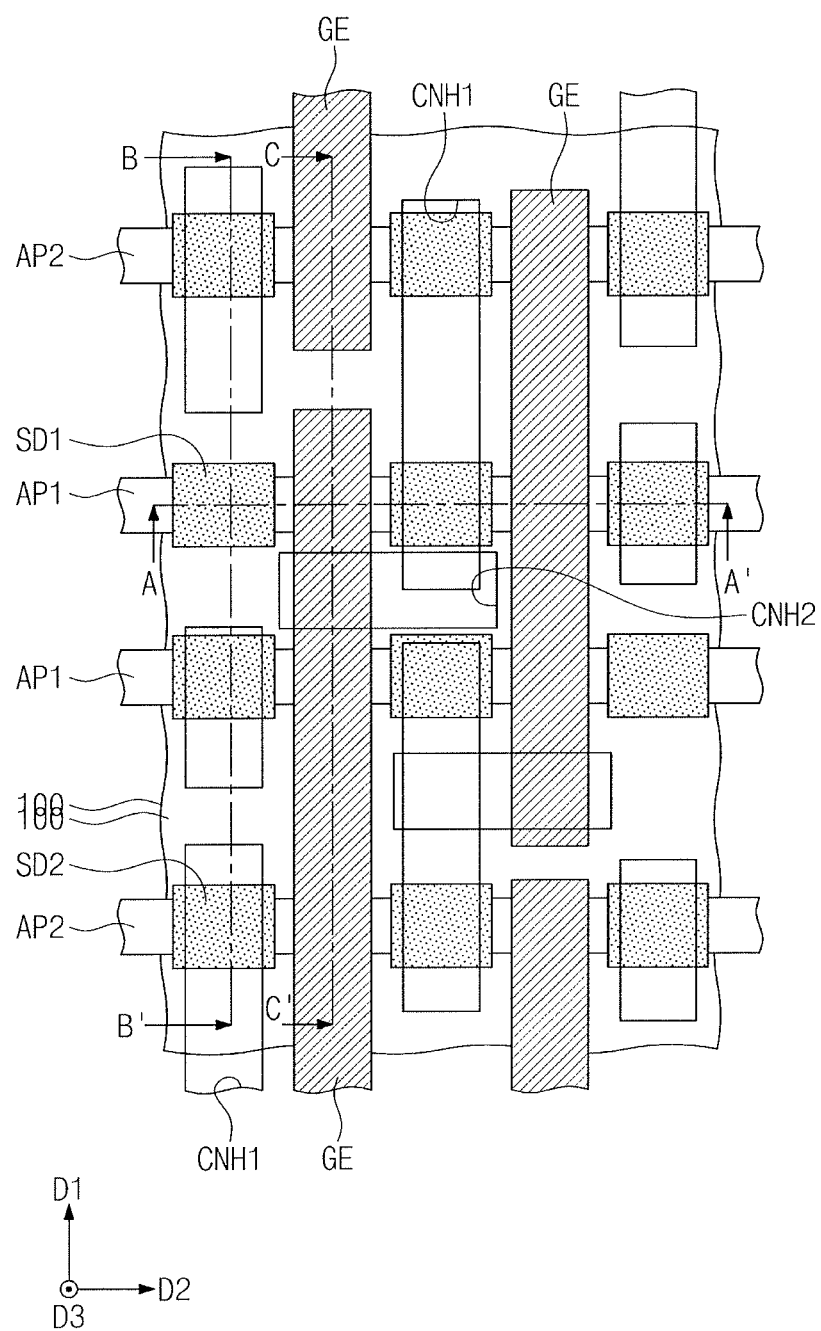
Figure 14A:
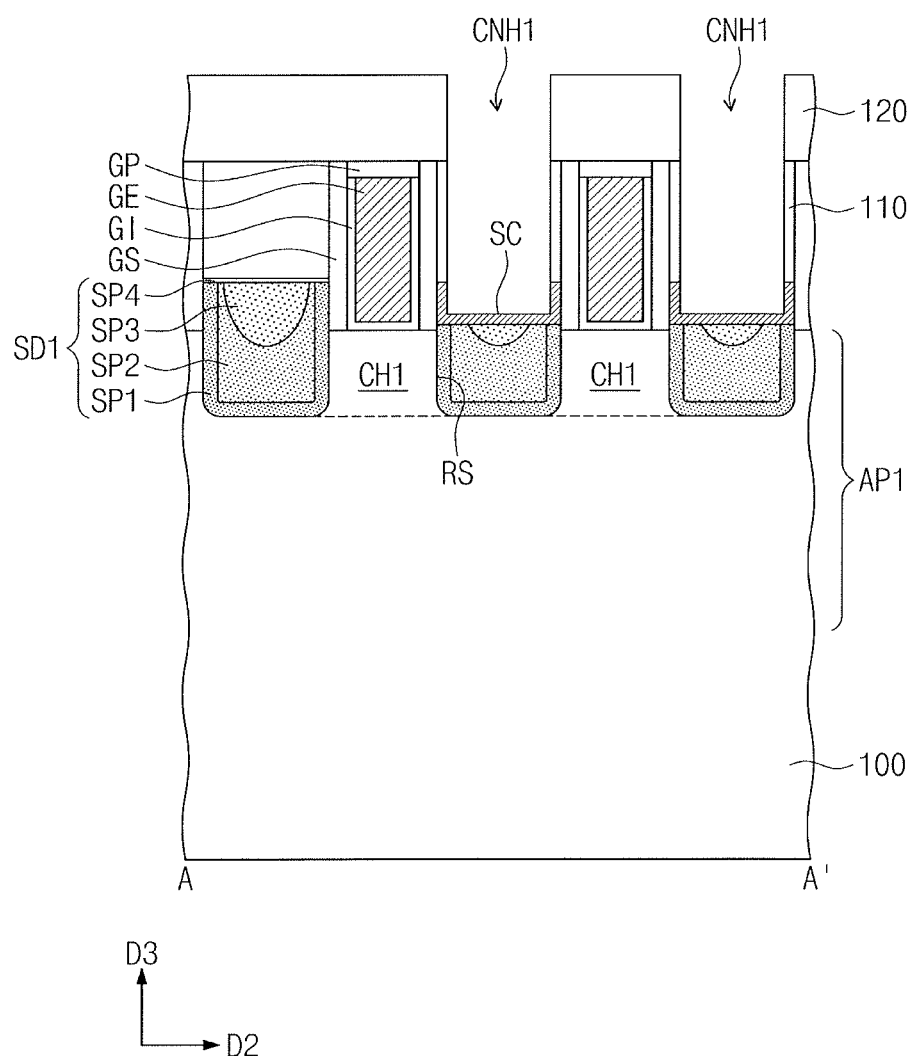
Figure 14B:
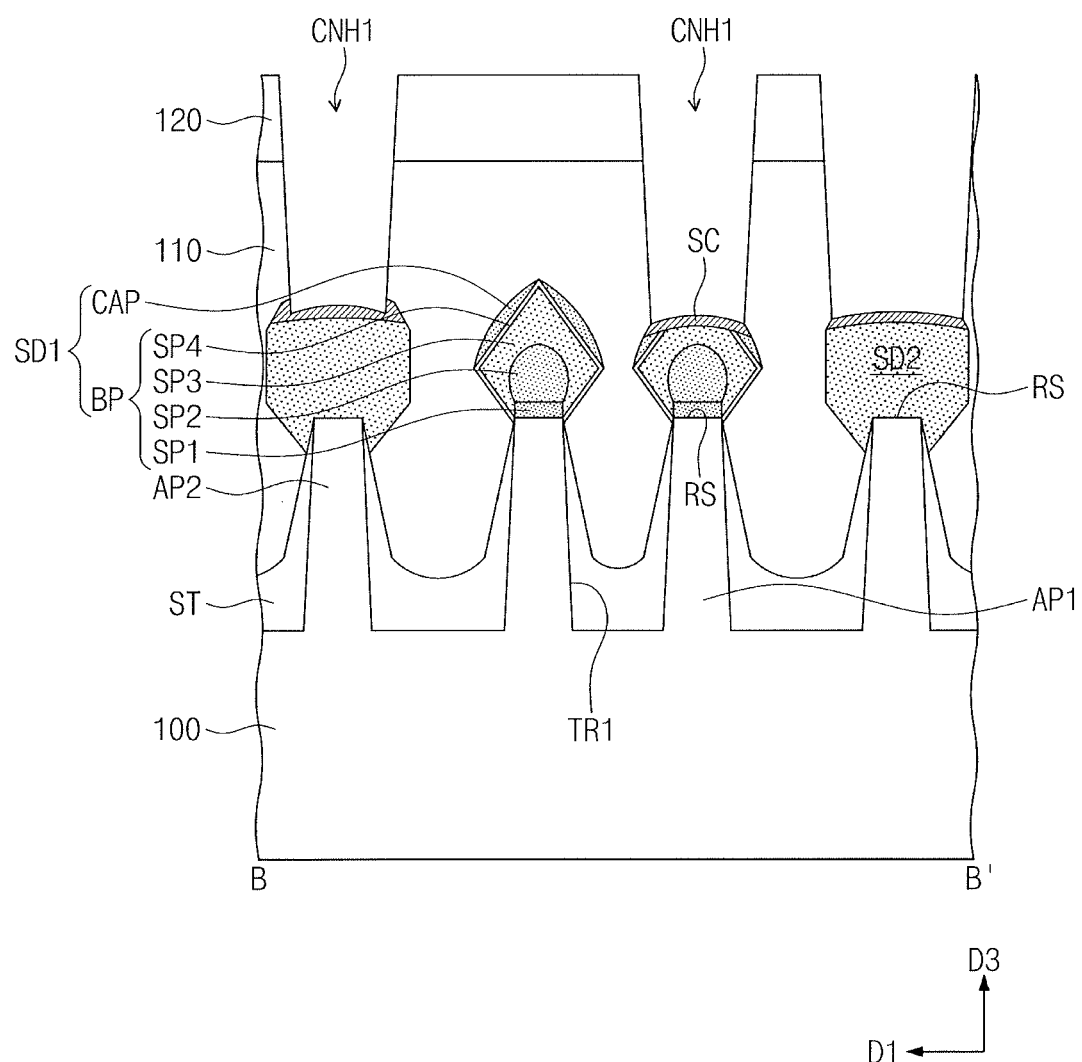
Figure 14C:
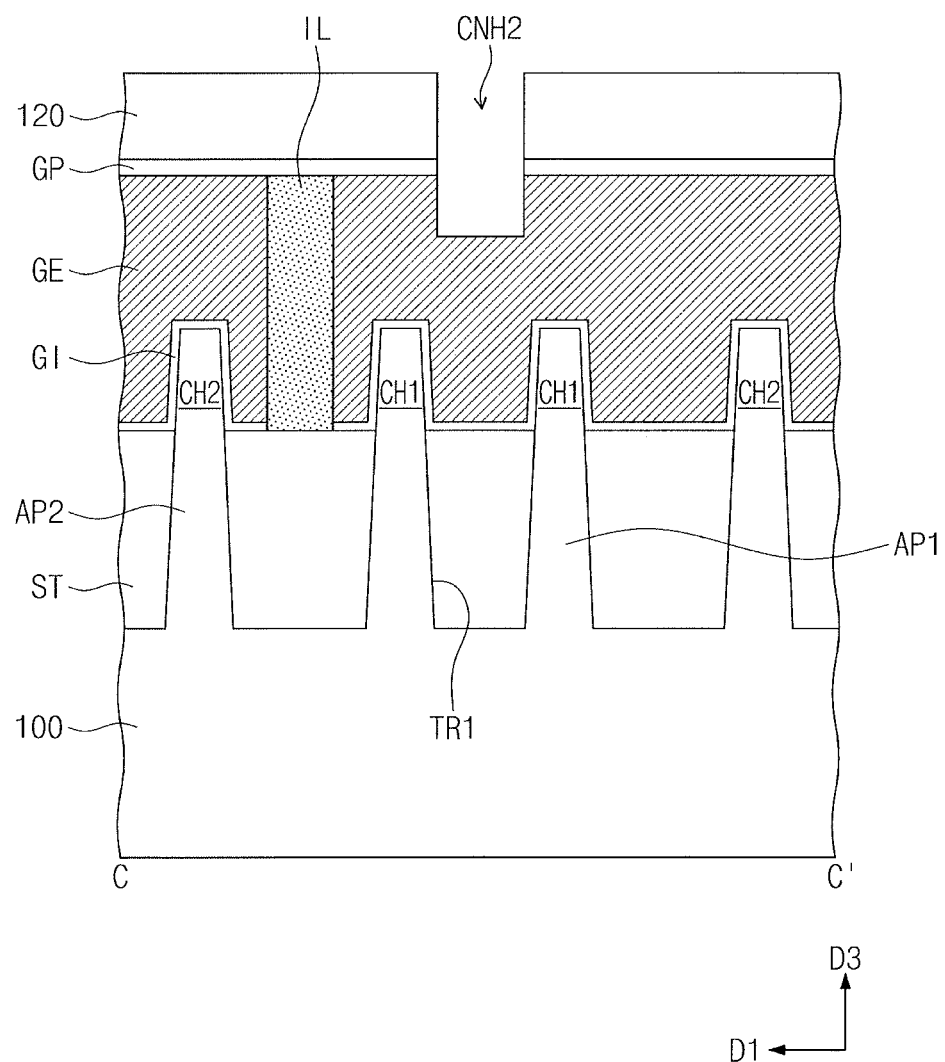

Referring to FIGS. 3 and 4, a substrate 100 may be patterned to form first and second active patterns AP1 and AP2. For example, the formation of the first and second active patterns AP1 and AP2 may include forming mask patterns on the substrate 100, and using the mask patterns as an etching mask to anisotropically etch the substrate 100. A first trench TR1 may be formed between a pair of neighboring active patterns AP1 and AP2.

A device isolation layer ST may be formed on the substrate 100, filling the first trench TR1. For example, a dielectric layer (e.g., a silicon oxide layer) may be formed on the substrate 100, covering the first and second active patterns AP1 and AP2. The dielectric layer may be recessed until upper portions of the first and second active patterns AP1 and AP2 are exposed.

Referring to FIGS. 5 and 6A to 6C, sacrificial patterns PP may be formed to run across the first and second active patterns AP1 and AP2. Each of the sacrificial patterns PP may have a linear shape that extends in a first direction D1. For example, the formation of the sacrificial patterns PP may include forming a sacrificial layer on an entire surface of the substrate 100, forming mask patterns MA on the sacrificial layer, and using the mask patterns MA as an etching mask to pattern the sacrificial layer. The sacrificial layer may include a polysilicon layer.

A pair of gate spacers GS may be formed on opposite sidewalls of each of the sacrificial patterns PP. The gate spacers GS may also be formed on opposite sidewalls of the upper portion of each of the first and second active patterns AP1 and AP2. The formation of the gate spacers GS may include conformally forming a spacer layer on the entire surface of the substrate 100 and anisotropically etching the spacer layer. The spacer layer may include one or more of $SiO_2$, SiCN, SiCON, and SiN. In an implementation, the spacer layer may include a multiple layer that consists of two or more of $SiO_2$, SiCN, SiCON, and SiN.

Referring to FIGS. 7 and 8A to 8C, recesses RS may be formed on the upper portion of each of the first and second active patterns AP1 and AP2. A pair of the recesses RS may be formed on opposite sides of each of the sacrificial patterns PP. The formation of the recesses RS may include performing an etching process in which the mask patterns MA and the gate spacers GS are used as an etching mask to etch the upper portions of the first and second active patterns AP1 and AP2. The etching process may remove the gate spacers GS on the opposite sidewalls of the upper portion of each of the first and second active patterns AP1 and AP2. An exposed device isolation layer ST may be recessed during the etching process.

Referring to FIGS. 9 and 10A to 10C, a first hardmask pattern MP may be formed to selectively cover the second active patterns AP2. The first hardmask pattern MP may include an opening OP that exposes the first active patterns AP1.

First source/drain patterns SD1 may be formed to fill the recesses RS of the first active patterns AP1 exposed to the opening OP. For example, the formation of the first source/drain patterns SD1 may include performing a selective epitaxial growth process in which exposed inner walls of the recesses RS are used as seed layers. A first channel CH1 may be defined between a pair of the first source/drain patterns SD1. For example, the selective epitaxial growth process may include a chemical vapor deposition (CVD) process or a molecular beam epitaxy (MBE) process.

Each of the first source/drain patterns SD1 may include a second semiconductor element whose lattice constant is greater than that of a first semiconductor element included in the substrate 100. For example, the first semiconductor element may be silicon, and the second semiconductor element may be germanium. Each of the first source/drain patterns SD1 may be formed to have a plurality of semiconductor layers. Each of the first source/drain patterns SD1 may include first to fourth semiconductor patterns SP1 to SP4 and a capping pattern CAP that are sequentially formed. The first to fourth semiconductor patterns SP1 to SP4 may constitute a body part BP, and the capping pattern CAP may be formed on the body part BP.

The first semiconductor pattern SP1 may be formed by a first selective epitaxial growth process in which the inner wall of the recess RS of the first active pattern AP1 is used as a seed layer. The first semiconductor pattern SP1 may contain the second semiconductor element whose concentration is low. The first semiconductor pattern SP1 may be doped to include low concentration impurities. For example, the first semiconductor pattern SP1 may include silicon-germanium (SiGe) in which boron (B) is doped. The first semiconductor pattern SP1 may contain germanium (Ge) in an amount of about 10 at % to about 30 at %.

The second semiconductor pattern SP2 may be formed by a second selective epitaxial growth process in which the first semiconductor pattern SP1 is used as a seed layer. The second semiconductor pattern SP2 may contain the second semiconductor element at a concentration that is is greater than that of the second semiconductor element contained in the first semiconductor pattern SP1. The second semiconductor pattern SP2 may be doped to include impurities at a concentration that is greater than that of impurities included in the first semiconductor pattern SP1. For example, the second semiconductor pattern SP2 may include silicon-germanium (SiGe) in which boron (B) is doped. The second semiconductor pattern SP2 may contain germanium (Ge) in an amount of about 25 at % to about 50 at %.

The third semiconductor pattern SP3 may be formed by a third selective epitaxial growth process in which the second semiconductor pattern SP2 is used as a seed layer. The third semiconductor pattern SP3 may contain the second semiconductor element at a concentration that is greater than that of the second semiconductor element contained in the second semiconductor pattern SP2. The third semiconductor pattern SP3 may be doped to include impurities at a concentration that is greater than that of impurities included in the second semiconductor pattern SP2. For example, the third semiconductor pattern SP3 may include silicon-germanium (SiGe) in which boron (B) is doped. The third semiconductor pattern SP3 may contain germanium (Ge) in an amount of about 40 at % to about 75 at %.

The fourth semiconductor pattern SP4 may be formed by a fourth selective epitaxial growth process in which the third semiconductor pattern SP3 is used as a seed layer. The fourth semiconductor pattern SP4 may conformally cover a surface of the third semiconductor pattern SP3. The fourth semiconductor pattern SP4 may contain the first semiconductor element that is the same as that of the substrate 100. For example, the fourth semiconductor pattern SP4 may include single crystalline silicon (Si). The fourth semiconductor pattern SP4 may contain silicon (Si) in an amount of about 95 at % to about 100 at %.

The fourth semiconductor pattern SP4 may include a first facet FA1, a second facet FA2, a third facet FA3, and a fourth facet FA4. For example, the body part BP may include the first facet FA1, the second facet FA2, the third facet FA3, and the fourth facet FA4. The first and second facets FA1 and FA2 or the third and fourth facets FA3 and FA4 may define a first corner edge SE1 that horizontally protrudes. The second and third facets FA2 and FA3 may define a second corner edge SE2 that vertically protrudes.

The capping pattern CAP may be selectively formed on the second and third facets FA2 and FA3 of the body part BP. The capping pattern CAP may not be formed on the first and fourth facets FA1 and FA4 of the body part BP. The capping pattern CAP may not cover the first corner edge SE1.

The capping pattern CAP may be formed by a fifth selective epitaxial growth process in which the fourth semiconductor pattern SP4 is used as a seed layer. For example, the capping pattern CAP may include germanium (Ge) or silicon-germanium (SiGe). The capping pattern CAP may contain germanium (Ge) in an amount of about 5 at % to about 100 at %. In an implementation, the capping pattern CAP may have a germanium (Ge) content of about 95 at % to about 100 at %.

The fifth selective epitaxial growth process may be performed at a temperature similar to or less than those of the first to fourth selective epitaxial growth processes. The fifth epitaxial growth process may use a process gas including an etching gas that contains HCl, $Cl_2$, or a combination thereof. When the fifth selective epitaxial growth process is adjusted on its process conditions (e.g., temperature, pressure, and etching gas amount), it may be possible to control selective growth of the capping pattern CAP only on the second facet FA2 and the third facet FA3.

Referring to FIGS. 11 and 12A to 12C, the first hardmask pattern MP may be removed, and a second hardmask pattern may be formed to selectively cover the first active patterns AP1. Second source/drain patterns SD2 may be formed to fill the recesses RS of the second active patterns AP2 exposed to the second hardmask pattern. For example, the formation of the second source/drain patterns SD2 may include performing a selective epitaxial growth process in which exposed inner walls of the recesses RS are used as seed layers. The second source/drain patterns SD2 may include the same first semiconductor element, such as silicon, as that of the substrate 100. Afterwards, the second hardmask pattern may be removed.

A first interlayer dielectric layer 110 may be formed to cover the first and second source/drain patterns SD1 and SD2, the gate spacers GS, and the mask patterns MA. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be performed to planarize the first interlayer dielectric layer 110. As a result, the first interlayer dielectric layer 110 may have a top surface substantially coplanar with those of the sacrificial patterns PP and those of the gate spacers GS.

The sacrificial patterns PP may be replaced with gate electrodes GE and a dielectric pattern IL. For example, an anisotropic etching process may be performed on the exposed sacrificial patterns PP. The anisotropic etching process may selectively etch the sacrificial patterns PP. The dielectric pattern IL may be formed in empty spaces where the sacrificial patterns PP are removed. Gate dielectric patterns GI and the gate electrodes GE may be formed in remaining empty spaces where the dielectric pattern IL is not formed.

The gate dielectric patterns GI may be conformally formed by an atomic layer deposition (ALD) process or a chemical oxidation process. For example, the gate dielectric pattern GI may include a high-k dielectric material. The formation of the gate electrodes GE may include forming a gate electrode layer on the gate dielectric patterns GI and performing a planarization process on the gate electrode layer. For example, the gate electrode layer may include one or more of metal and conductive metal nitride.

The gate electrodes GE may be recessed by selectively etching upper portions thereof. The recessed gate electrodes GE may have their top surfaces lower than that of the first interlayer dielectric layer 110 and those of the gate spacers GS. Gate capping patterns GP may be formed on the recessed gate electrodes GE. The formation of the gate capping patterns GP may include forming a gate capping layer to cover the recessed gate electrodes GE and performing a planarization process on the gate capping layer until the top surface of the first interlayer dielectric layer 110 is exposed. For example, the gate capping layer may include one or more of SiON, SiCN, SiCON, and SiN.

Referring to FIGS. 13 and 14A to 14C, a second interlayer dielectric layer 120 may be formed on the first interlayer dielectric layer 110, covering the gate capping patterns GP. First contact holes CNH1 may be formed to penetrate the second interlayer dielectric layer 120 and the first interlayer dielectric layer 110, exposing the first and second source/drain patterns SD1 and SD2. Second contact holes CNH2 may be formed to penetrate the second interlayer dielectric layer 120, the first interlayer dielectric layer 110, and the gate capping patterns GP, exposing the gate electrodes GE.

When an etching process is performed to form the first contact holes CNH1, the etching process may etch upper portions of the first and second source/drain patterns SD1 and SD2. Silicide layers SC may be formed by performing a silicidation process on the first and second source/drain patterns SD1 and SD2 exposed to the first contact holes CNH1. For example, the silicide layers SC may include one or more of titanium silicide, tantalum silicide, tungsten silicide, nickel silicide, and cobalt silicide.

Referring back to FIGS. 1 and 2A to 2C, active contacts AC may be formed in the first contact holes CNH1, contacting the first and second source/drain patterns SD1 and SD2. Gate contacts GC may be formed in the second contact holes CNH2, contacting the gate electrodes GE. The formation of the active contacts AC and the gate contacts GC may include forming a barrier pattern BM to partially fill each of the first and second contact holes CNH1 and CNH2, and forming a conductive pattern FM on the barrier pattern BM.

Figure 15:
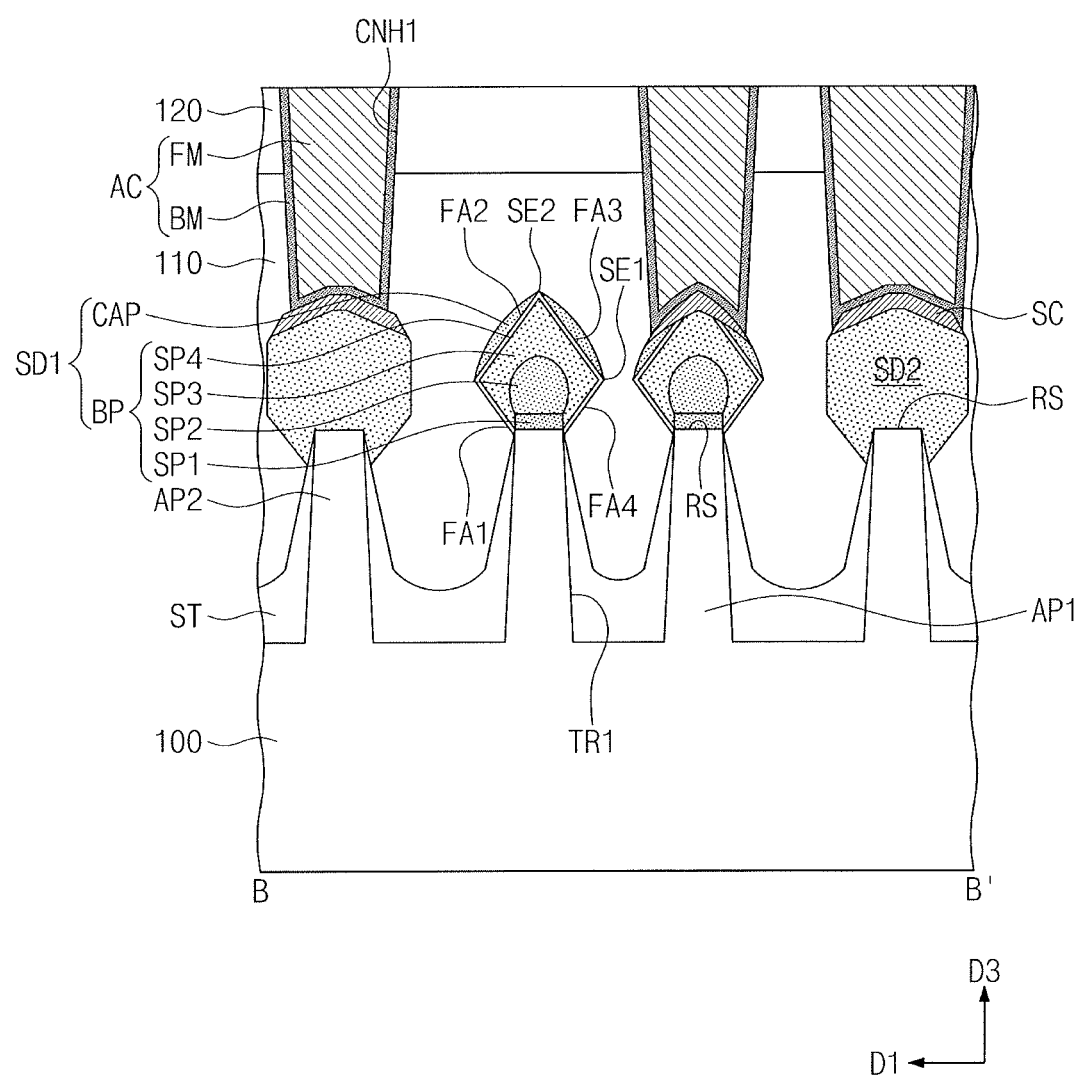
FIGS. 15, 16, and 17 illustrate cross-sectional views taken along line D-D' of FIG. 1, showing a semiconductor device according to some example embodiments.
Figure 16:
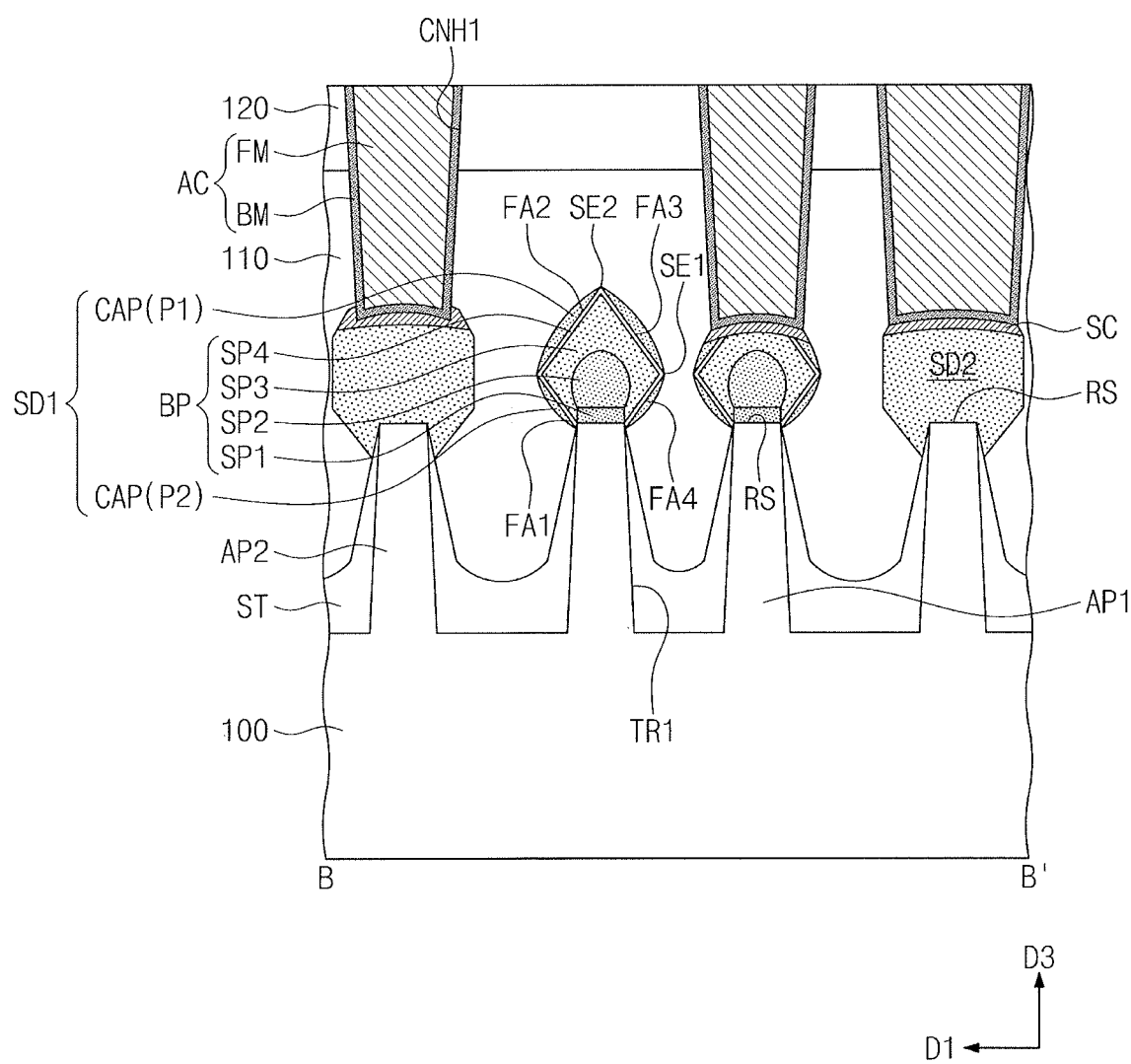
Figure 17:
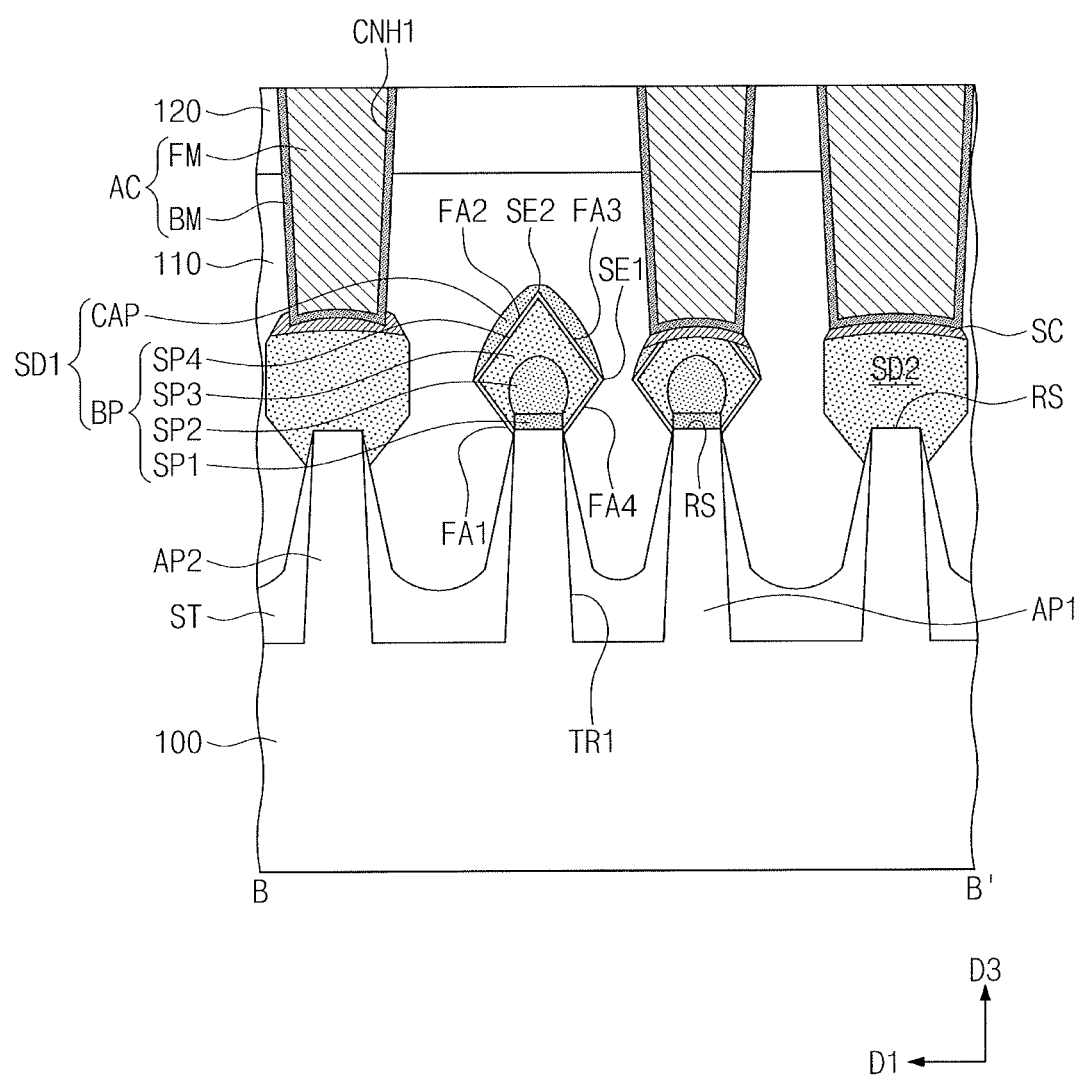

FIGS. 15, 16, and 17 illustrate cross-sectional views taken along line D-D' of FIG. 1, showing a semiconductor device according to some example embodiments. In the embodiment that follows, a repeated detailed description of technical features relative to those of the semiconductor device discussed above with reference to FIGS. 1 and 2A to 2C may be omitted, and a difference thereof will be discussed in detail.

Referring to FIGS. 1, 2A, 2C, and 15, the silicide layer SC may have a surface that conforms to a surface profile of the first source/drain pattern SD1 or the second source/drain pattern SD2 beneath the silicide layer SC. For example, a shape of the first source/drain pattern SD1 and its overlying silicide layer SC may be similar to that of the first source/drain pattern SD1 having no silicide layer SC thereon. The silicide layer SC on the first source/drain pattern SD1 may have a top end at a level substantially the same as that of a top end (e.g., the second corner edge SE2) of the first source/drain pattern SD1 having no silicide layer SC thereon.

Referring back to FIGS. 13 and 14A to 14C, the formation of the silicide layer SC and the active contact AC may include forming the first contact holes CNH1 by performing a selective etching process that selectively etches the first and second interlayer dielectric layers 110 and 120 except for the first and second source/drain patterns SD1 and SD2. The first and second source/drain patterns SD1 and SD2 may be exposed by the selective etching process, but may maintain their shapes even after the first contact holes CNH1 are formed. When a silicidation process is performed on the exposed first and second source/drain patterns SD1 and SD2, the exposed first and second source/drain patterns SD1 and SD2 may be converted into the silicide layers SC.

Referring to FIGS. 1, 2A, 2C, and 16, the capping pattern CAP may include a first segment P1 and a second segment P2. The first segment P1 may cover the second and third facets FA2 and FA3 of the body part BP, and the second segment P2 may cover the first and fourth facets FA1 and FA4 of the body part BP. The first and second segments P1 and P2 may not cover the first and second corner edges SE1 and SE2 of the body part BP. The second segment P2 may have a maximum thickness less than that of the first segment P1.

Referring to FIGS. 1, 2A, 2C, and 17, the capping pattern CAP may not cover the first corner edge SE1 of the body part BP, and may cover the second corner edge SE2 of the body part BP. For example, the capping pattern CAP may have a top end at a higher level than that of the second corner edge SE2.

Figure 18:
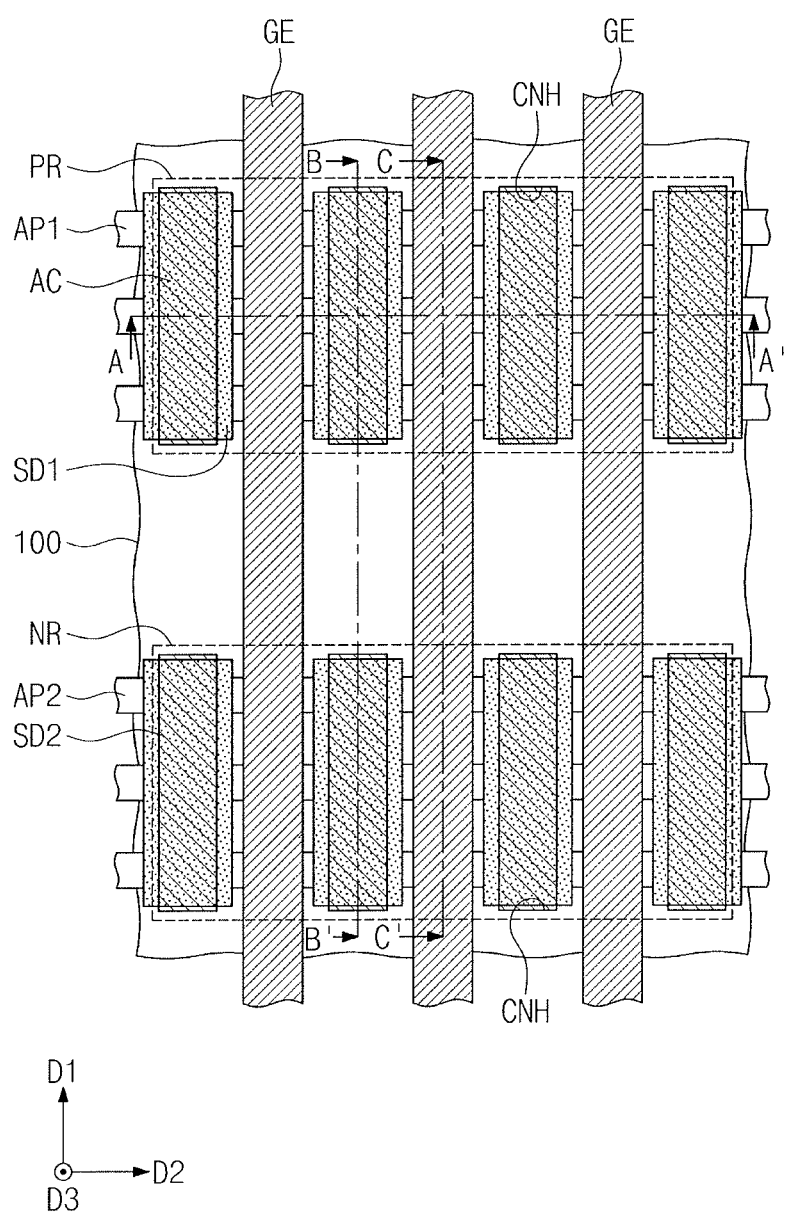
FIG. 18 illustrates a plan view showing a semiconductor device according to some example embodiments.
Figure 19A:
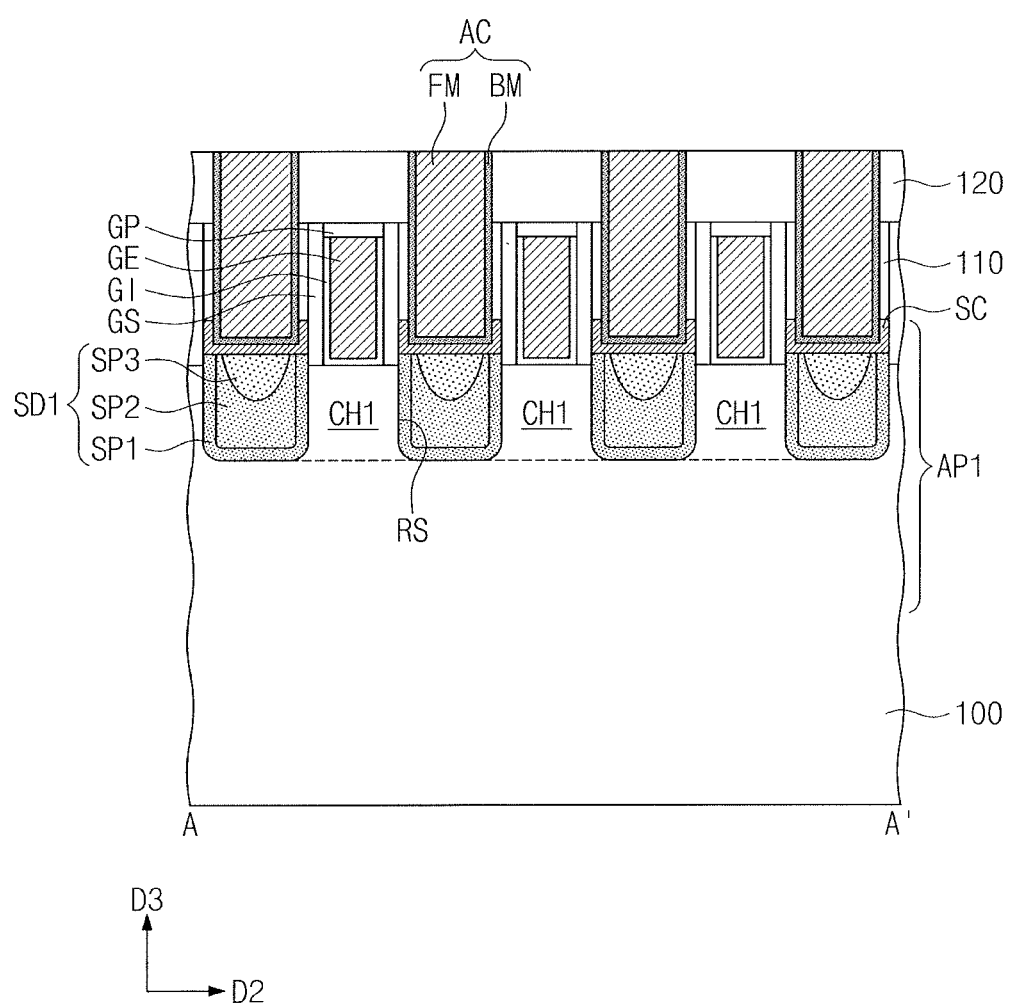
FIGS. 19A, 19B, and 19C illustrate cross-sectional views respectively taken along lines A-A', B-B', and C-C' of FIG. 16.
Figure 19B:
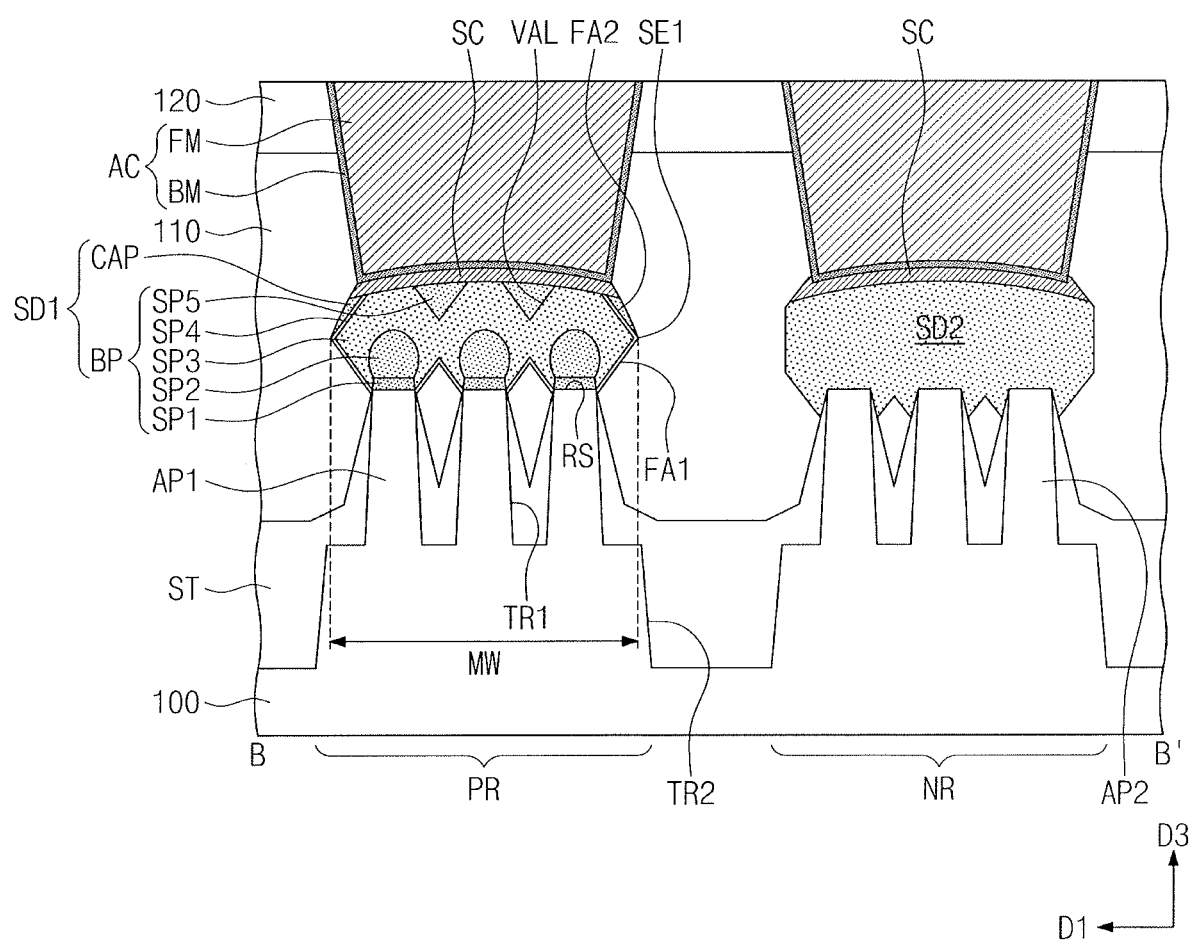
Figure 19C:
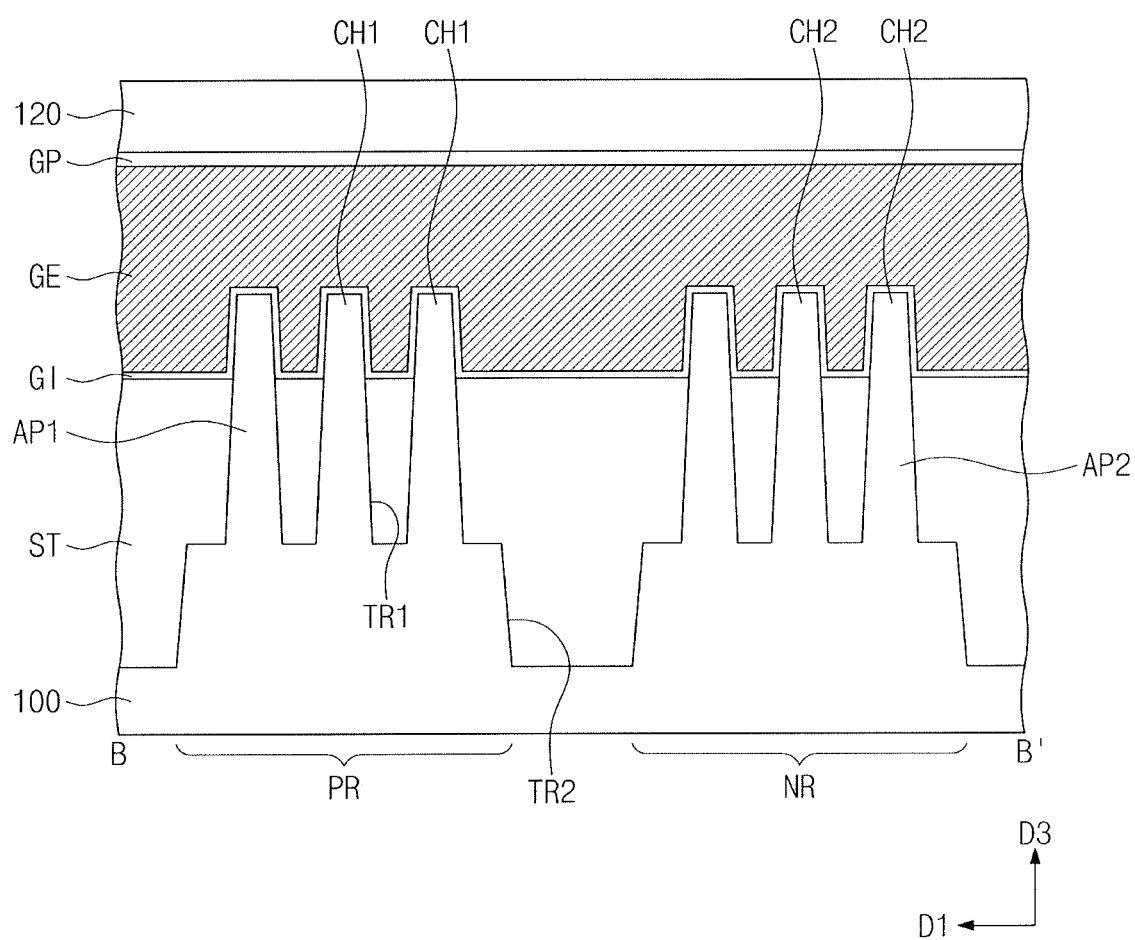

FIG. 18 illustrates a plan view showing a semiconductor device according to some example embodiments. FIGS. 19A, 19B, and 19C illustrate cross-sectional views respectively taken along lines A-A', B-B', and C-C' of FIG. 16. In the embodiment that follows, a repeated detailed description of technical features relative to those discussed above with reference to FIGS. 1 and 2A to 2C may be omitted, and a difference thereof will be discussed in detail.

Referring to FIGS. 18 and 19A to 19C, at least one logic cell may be provided on a substrate 100. The logic cell may include logic transistors that constitute a logic circuit of a semiconductor device. For example, the logic cell of the substrate 100 may include logic transistors constituting a processor core or an I/O terminal.

The substrate 100 may include a PMOSFET region PR and an NMOSFET region NR. The PMOSFET region PR and the NMOSFET region NR may be defined by a second trench TR2 formed on an upper portion of the substrate 100. For example, the second trench TR2 may be formed between the PMOSFET region PR and the NMOSFET region NR. The PMOSFET region PR and the NMOSFET region NR may be spaced apart in a first direction D1 from each other across the second trench TR2. The PMOSFET region PR and the NMOSFET region NR may extend in a second direction D2 intersecting the first direction D1.

The PMOSFET region PR and the NMOSFET region NR may be provided thereon with a plurality of active patterns AP1 and AP2 that extend in the second direction D2. The active patterns AP1 and AP2 may include first active patterns AP1 on the PMOSFET region PR and second active patterns AP2 on the NMOSFET region NR. The first and second active patterns AP1 and AP2 may be vertically protruding portions of the substrate 100. A first trench TR1 may be defined between neighboring first active patterns AP1 and between neighboring second active patterns AP2. The second trench TR2 may be deeper than the first trench TR1.

A device isolation layer ST may fill the first and second trenches TR1 and TR2.

The first and second active patterns AP1 and AP2 may have their upper portions that vertically protrude beyond the device isolation layer ST.

First channels CH1 and first source/drain patterns SD1 may be provided on the upper portions of the first active patterns AP1. Second channels CH2 and second source/drain patterns SD2 may be provided on the upper portions of the second active patterns AP2. The first source/drain patterns SD1 may be p-type impurity regions. The second source/drain patterns SD2 may be n-type impurity regions. The first and second source/drain patterns SD1 and SD2 may be epitaxial patterns formed by a selective epitaxial growth process.

Gate electrodes GE may be provided to extend in the second direction D2, while running across the first and second active patterns AP1 and AP2. The gate electrodes GE may be spaced apart from each other in the first direction D1. For example, the gate electrodes GE may include one or more of metal and conductive metal nitride. A pair of gate spacers GS may be on opposite sidewalls of each of the gate electrodes GE. Gate dielectric patterns GI may be between the gate electrode GE and the first active pattern AP1 and between the gate electrode GE and the second active pattern AP2. A gate capping pattern GP may be provided on each of the gate electrodes GE.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may be provided thereon with a second interlayer dielectric layer 120 that covers top surfaces of the gate capping patterns GP and top surfaces of the gate spacers GS.

Active contacts AC may be provided between the gate electrodes GE. The active contacts AC may penetrate the second interlayer dielectric layer 120 and the first interlayer dielectric layer 110, and may be coupled to the first and second source/drain patterns SD1 and SD2.

The first source/drain pattern SD1 may be provided on three first active patterns AP1 adjacent to each other in the first direction D1. For example, the first source/drain patterns SD1 on adjacent first active patterns AP1 may be merged with other to constitute a single source/drain pattern.

The first source/drain pattern SD1 may include a body part BP and a capping pattern CAP on the body pat BP. The body part BP may include first to fourth semiconductor patterns SP1 to SP4, and may further include a fifth semiconductor pattern SP5.

The fifth semiconductor pattern SP5 may be provided on the third semiconductor pattern SP3. The fifth semiconductor pattern SP5 may be between the third semiconductor pattern SP3 and a silicide layer SC. The third semiconductor pattern SP3 may include valleys VAL. The third semiconductor pattern SP3 may have a top surface a portion of which is recessed toward the substrate 100, and the valley VAL may be the recessed portion of the top surface of the third semiconductor pattern SP3. For example, the valley VAL may be a recess formed on the top surface of the third semiconductor pattern SP3. The valley VAL may be on a space between a pair of neighboring first active patterns AP1. The fifth semiconductor pattern SP5 may fill the valley VAL of the third semiconductor pattern SP3.

Figure 25A:
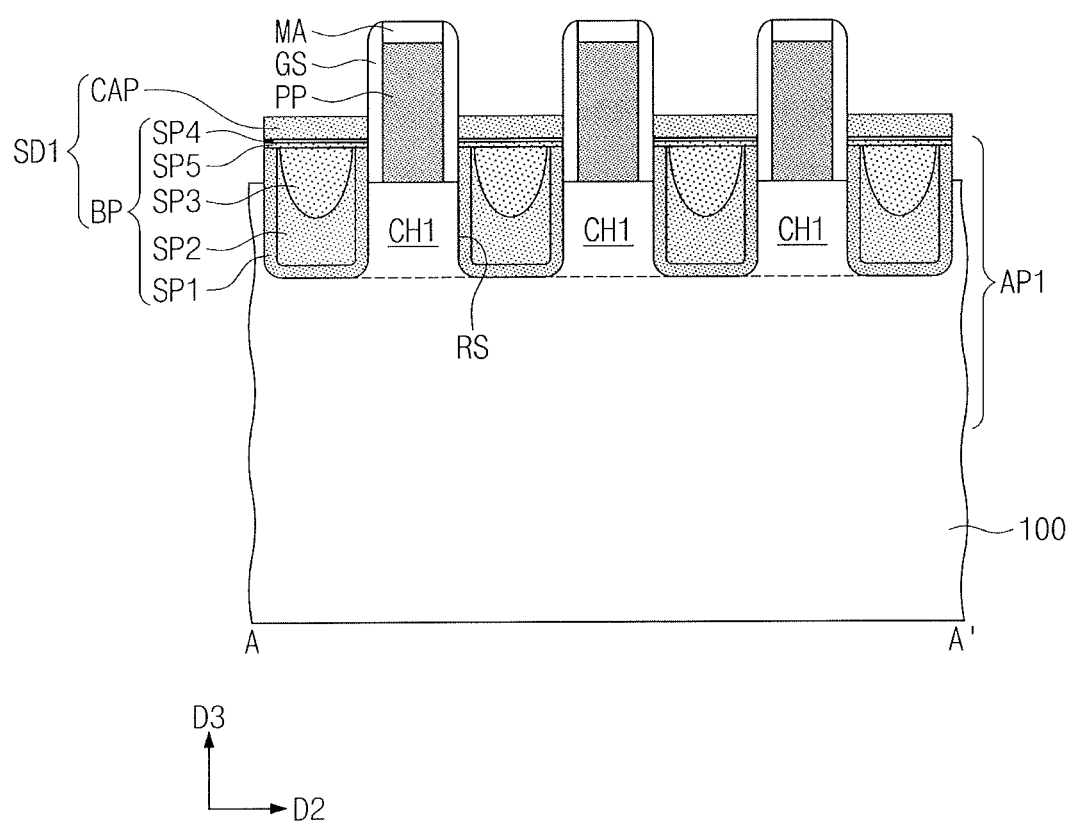
Figure 25B:
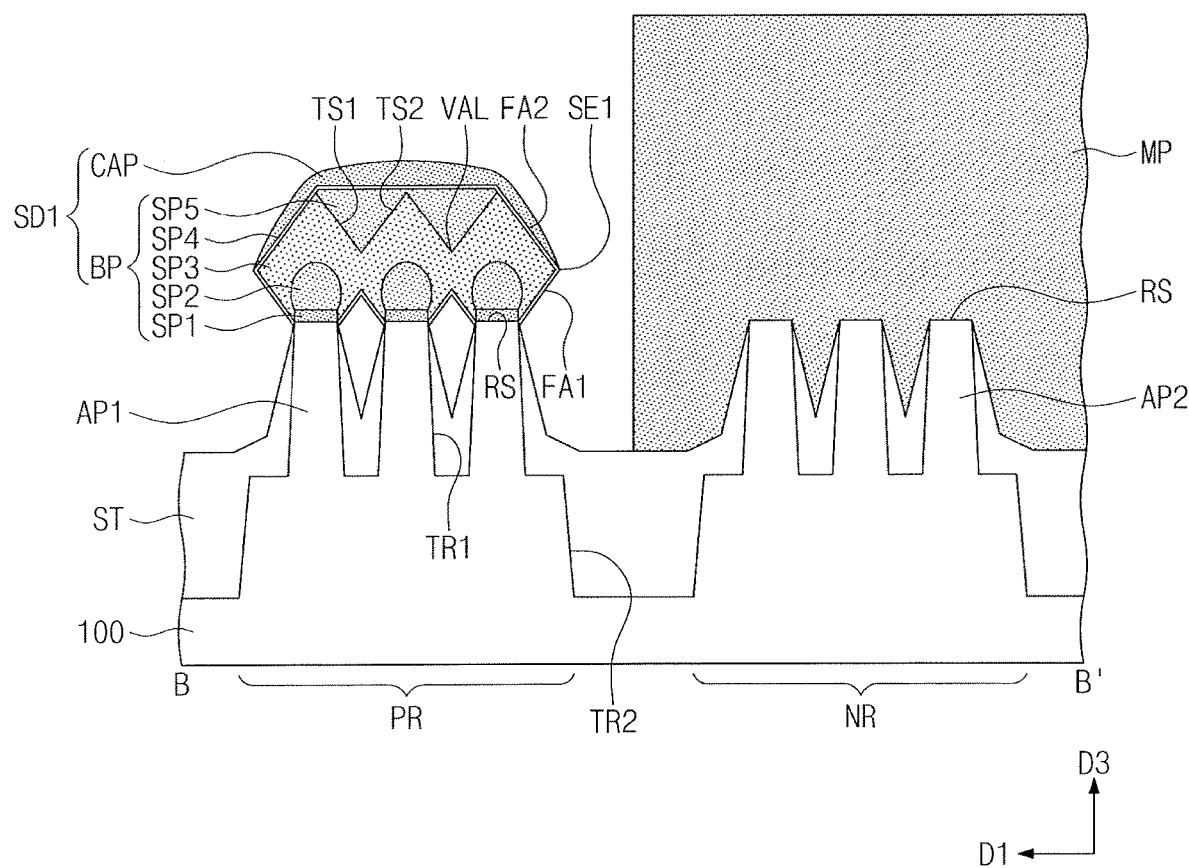
Figure 25C:
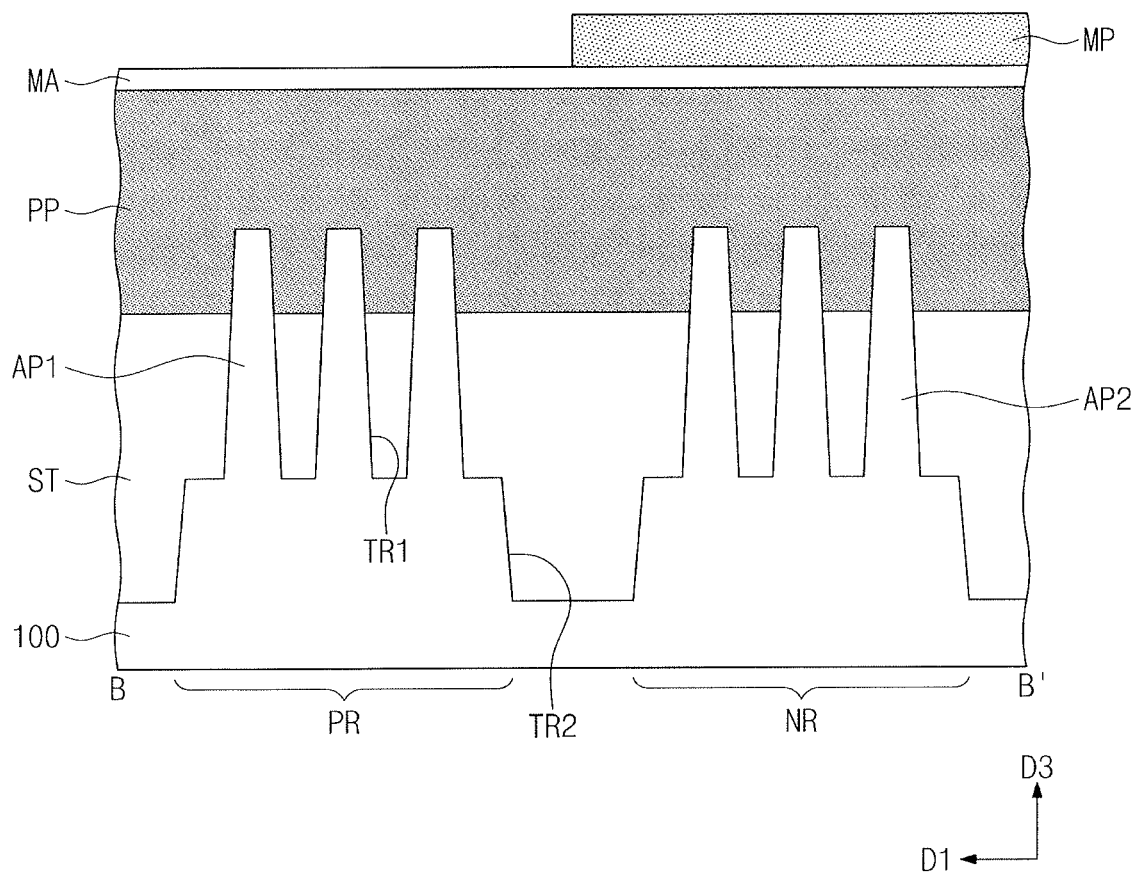
Figure 26:
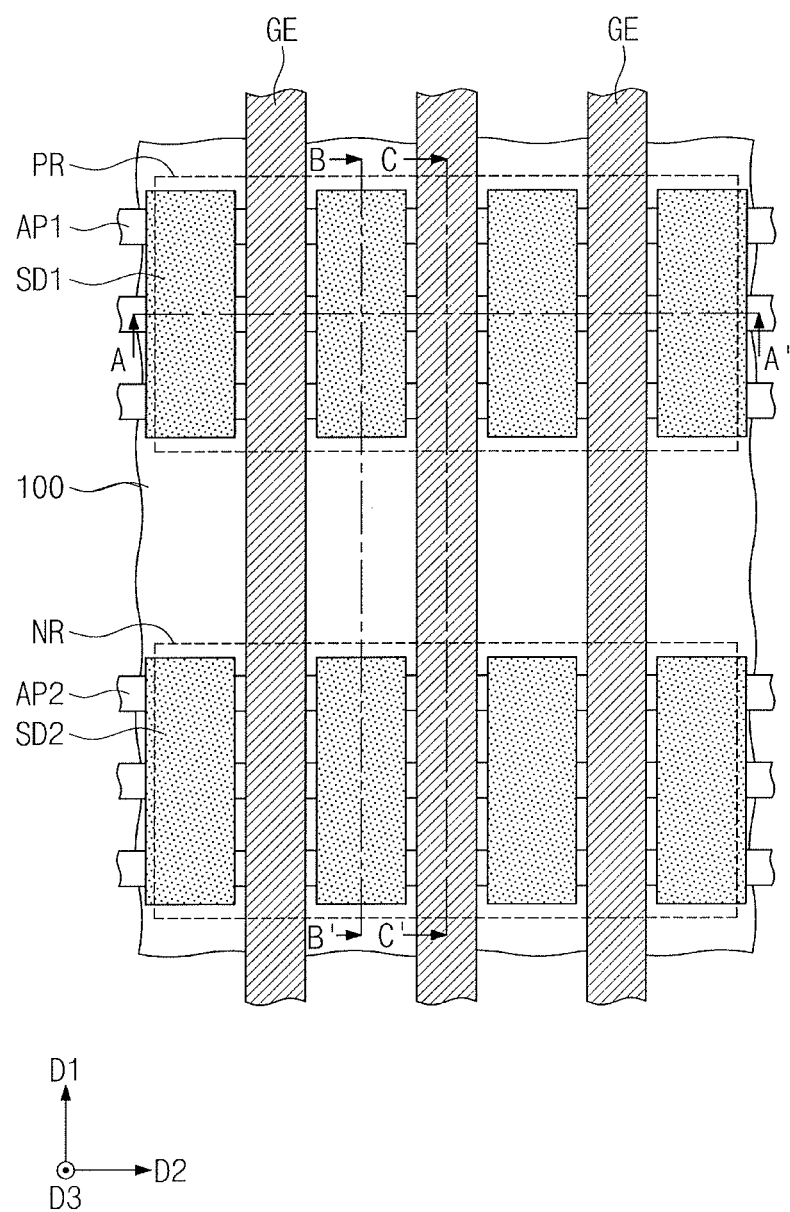
Figure 27A:
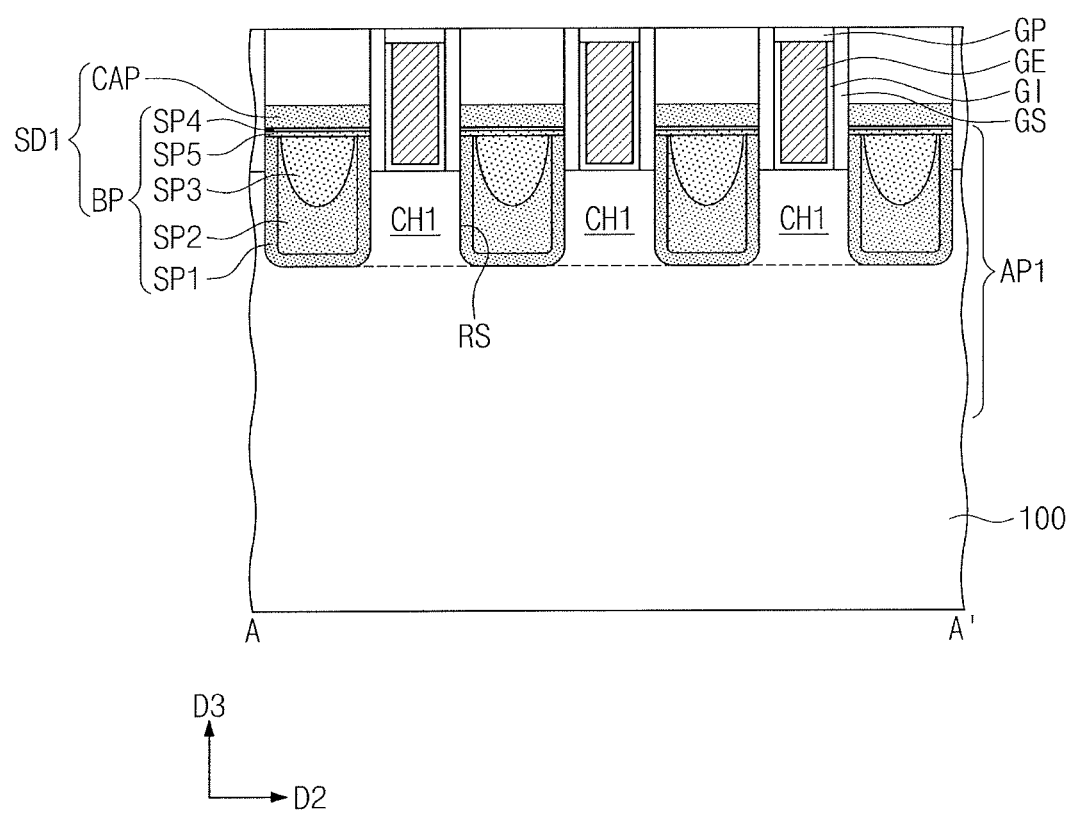
Figure 27B:
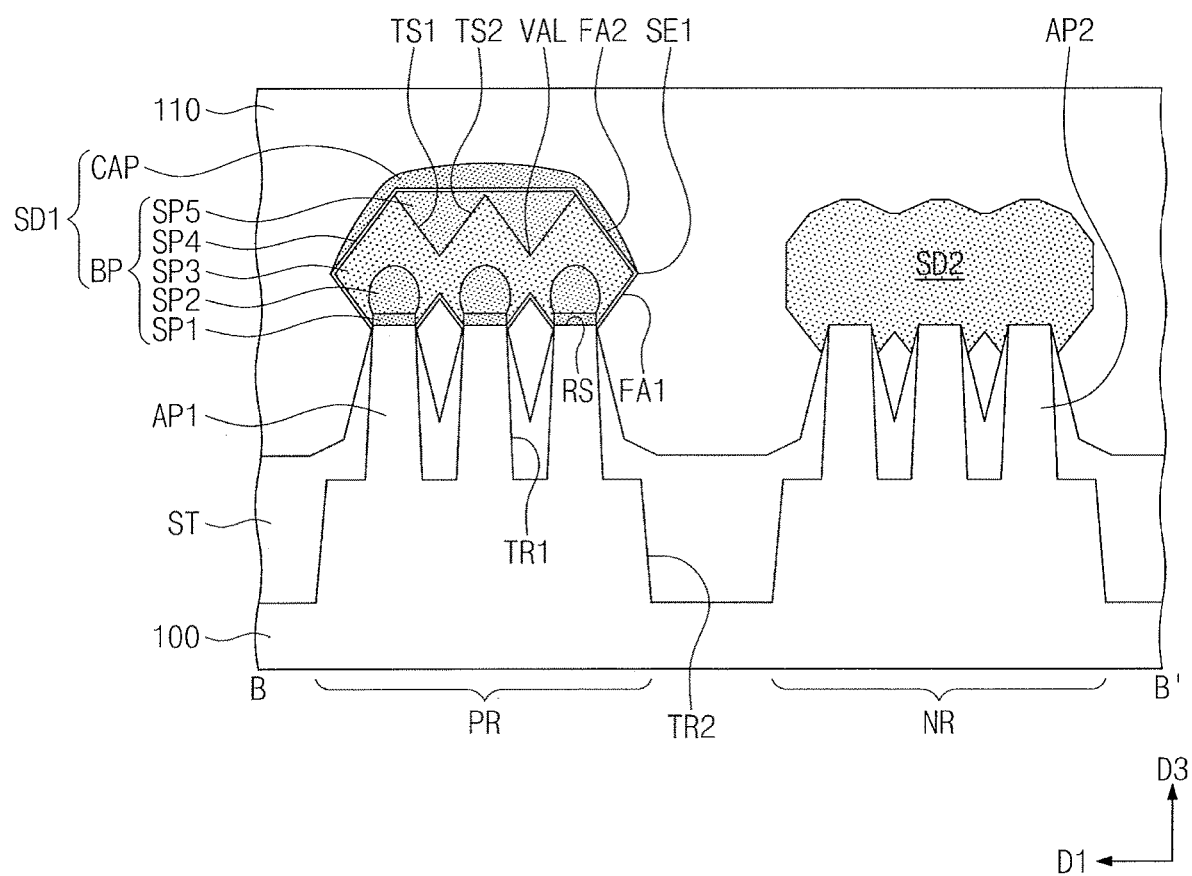
Figure 27C:
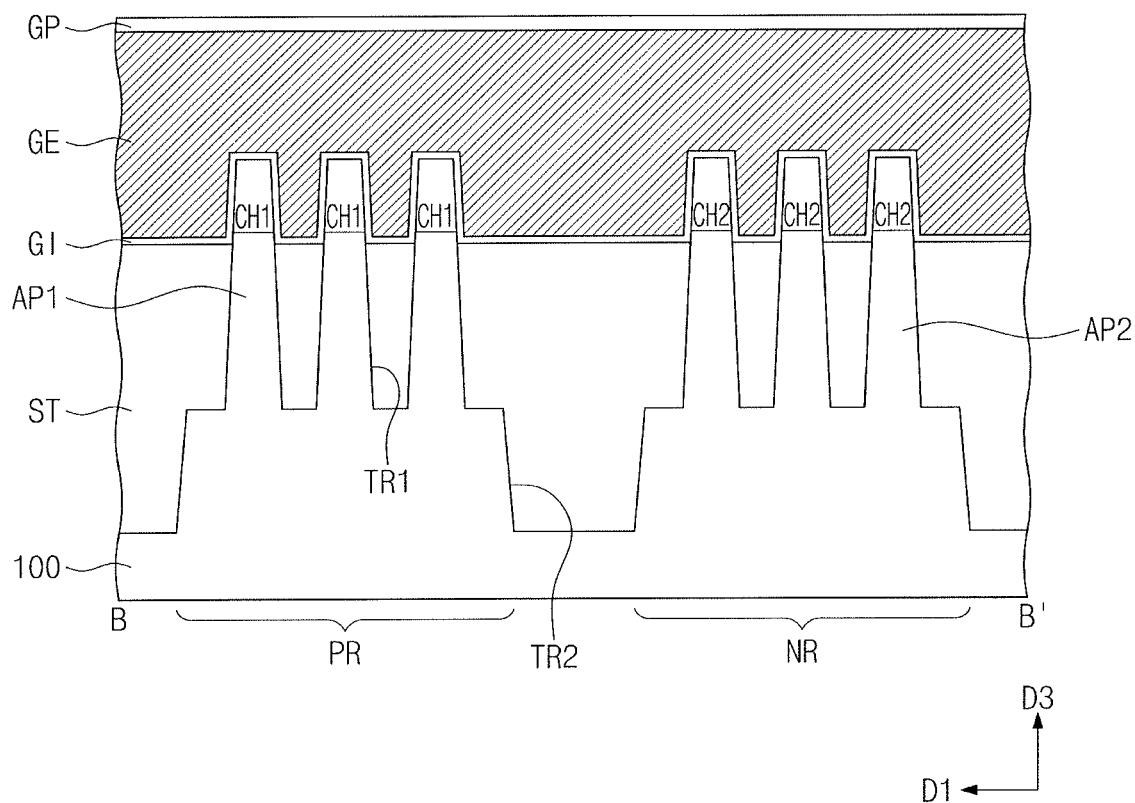
Figure 28:
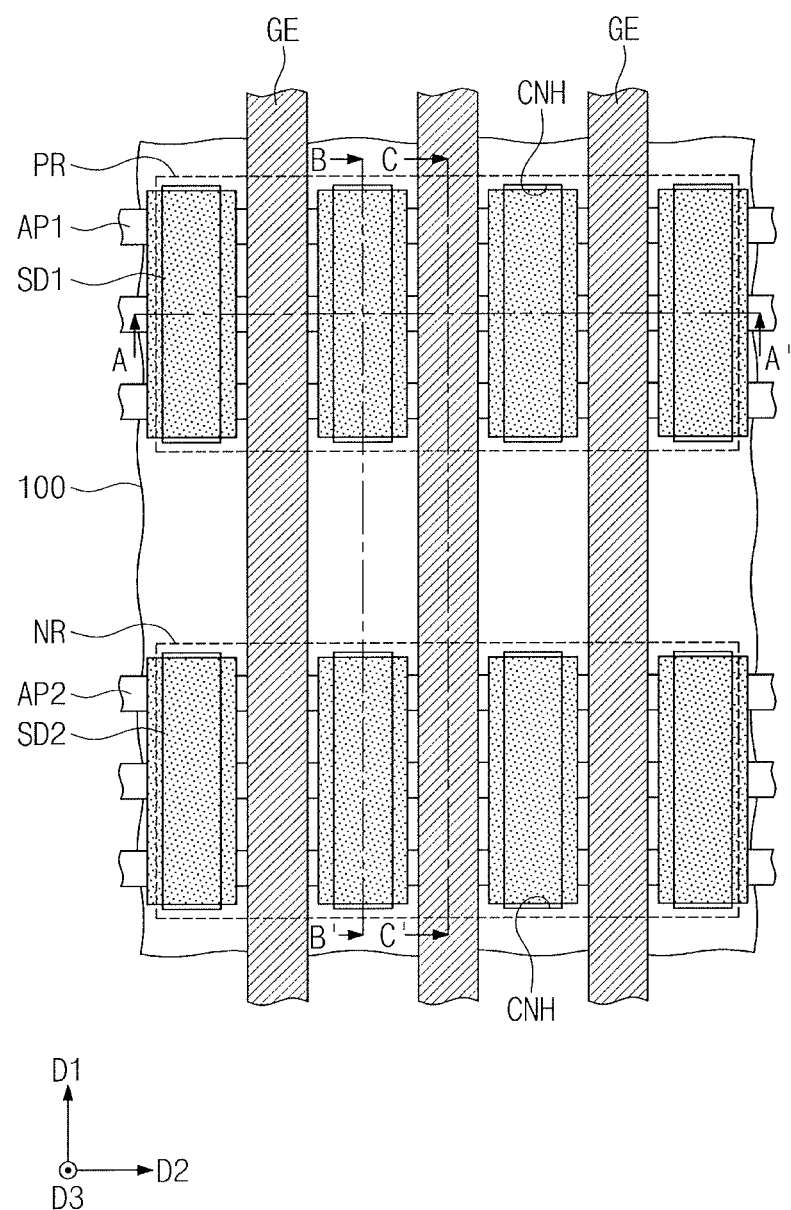
Figure 29A:
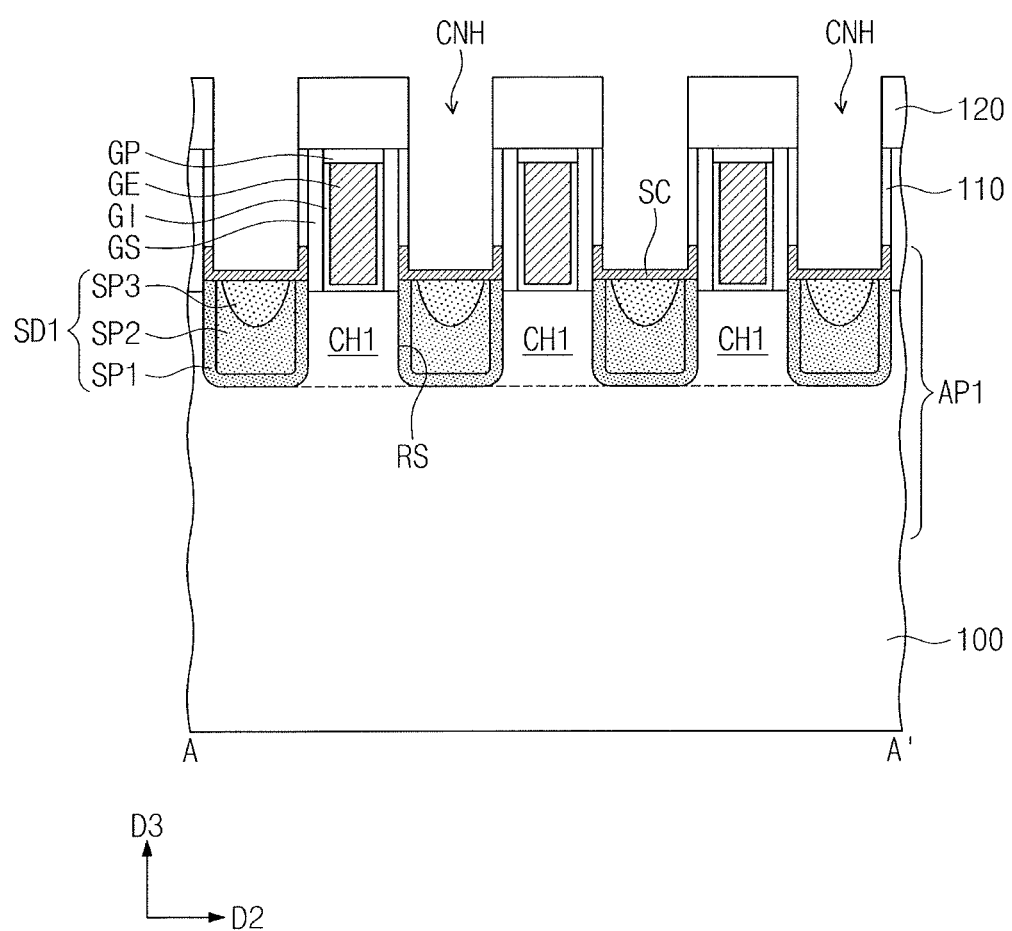
Figure 29B:
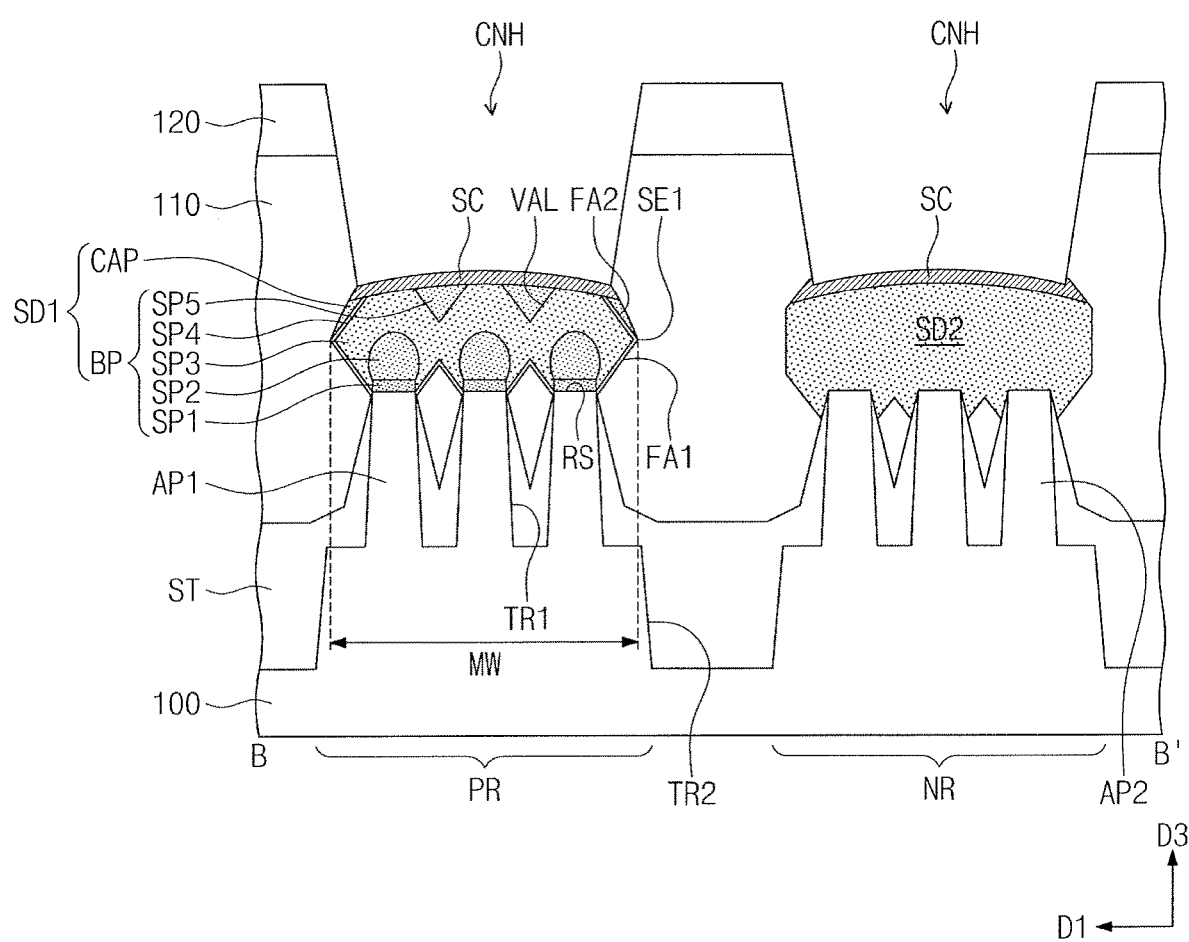
Figure 29C:
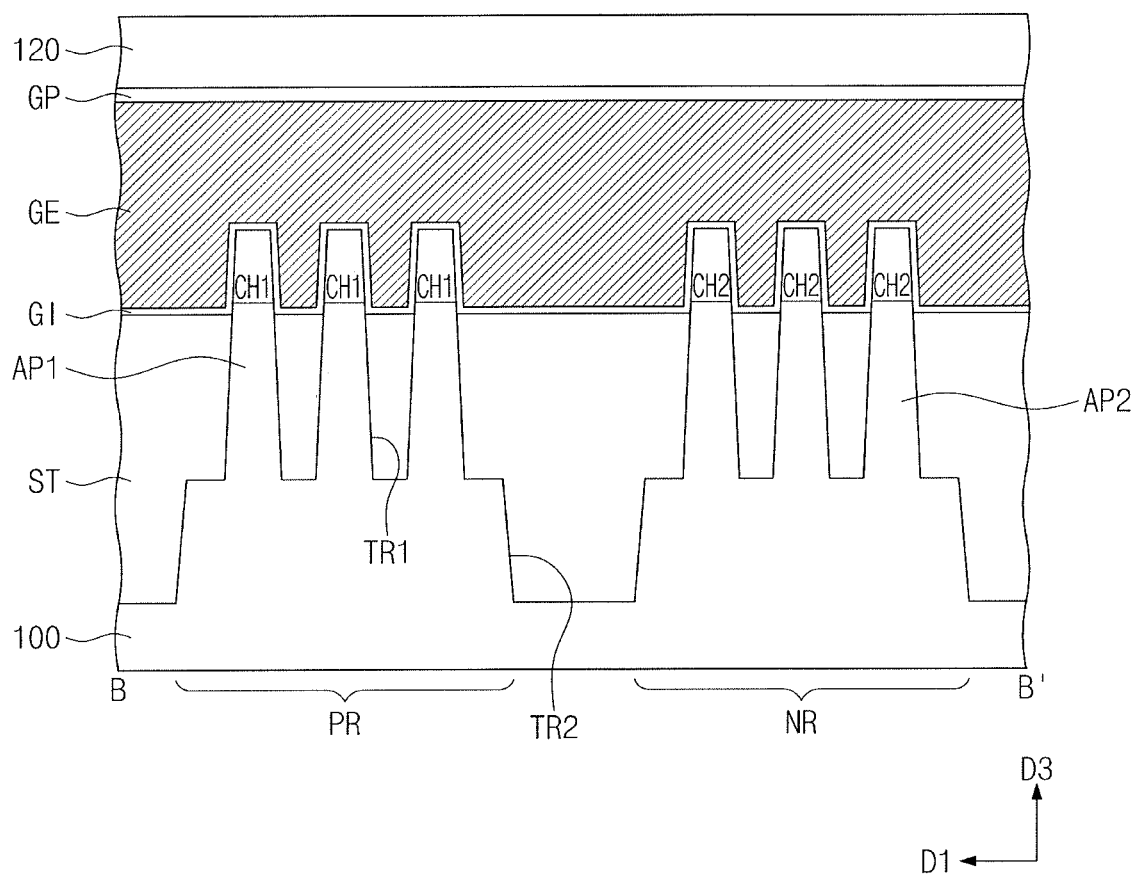

The valley VAL may be defined by connecting adjacent (111) planes of the top surface of the third semiconductor pattern SP3 (see TS1 and TS2 of FIG. 25B). The fifth semiconductor pattern SP5 may selectively cover the (111) planes that define the valley VAL of the third semiconductor pattern SP3. The fourth semiconductor pattern SP4 may cover other planes of the third semiconductor pattern SP3, which other planes are not covered with the fifth semiconductor pattern SP5.

The fifth semiconductor pattern SP5 may include silicon-germanium (SiGe). The fifth semiconductor pattern SP5 may contain germanium (Ge) in an amount that is is greater than that of germanium (Ge) in the second semiconductor pattern SP2. The fifth semiconductor pattern SP5 may have a germanium (Ge) content equal to or less than that of the third semiconductor pattern SP3. For example, the germanium (Ge) content of the fifth semiconductor pattern SP5 may be about 40 at % to about 75 at %.

The body part BP of the first source/drain pattern SD1 may include a first facet FA1 and a second facet FA2. The first facet FA1 and the second facet FA2 may face an adjacent second source/drain pattern SD2. The first facet FA1 and the second facet FA2 may be (111) planes. The first facet FA1 and the second facet FA2 may define a first corner edge SE1. The first corner edge SE1 may horizontally protrude toward the adjacent second source/drain pattern SD2.

The capping pattern CAP may be provided on the body part BP. For example, the capping pattern CAP may not cover the first facet FA1 and may selectively cover the second facet FA2. The capping pattern CAP may not cover, but expose the first corner edge SE1.

The first source/drain pattern SD1 may have a maximum width MW in the first direction D1 at a level at which the first corner edge SE1 is located. The maximum width MW of the first source/drain pattern SD1 may be substantially the same as that of the body part BP. This may be because that the capping pattern CAP does not cover the first corner edge SE1 and selectively covers the second facet FA2.

The silicide layer SC may be between the first source/drain pattern SD1 and the active contact AC. The silicide layer SC may cover the third, fourth, and fifth semiconductor patterns SP3, SP4, and SP5. The silicide layer SC may cover the capping pattern CAP. The capping pattern CAP may help increase a contact area between the first source/drain pattern SD1 and the active contact AC (or the silicide layer SC).

FIGS. 20, 22, 24, 26, and 28 illustrate plan views of a method of manufacturing a semiconductor device according to some example embodiments. FIGS. 21, 23A, 25A, 27A, and 29A illustrate cross-sectional views taken along line A-A' of FIGS. 20, 22, 24, 26, and 28, respectively. FIGS. 23B, 25B, 27B, and 29B illustrate cross-sectional views taken along line B-B' of FIGS. 22, 24, 26, and 28, respectively. FIGS. 23C, 25C, 27C, and 29C illustrate cross-sectional views taken along line C-C' of FIGS. 22, 24, 26, and 28, respectively. In the embodiment that follows, a repeated detailed description of technical features relative to those discussed with reference to FIGS. 1 to 14 may be omitted, and a difference thereof will be discussed in detail.

Figure 21:
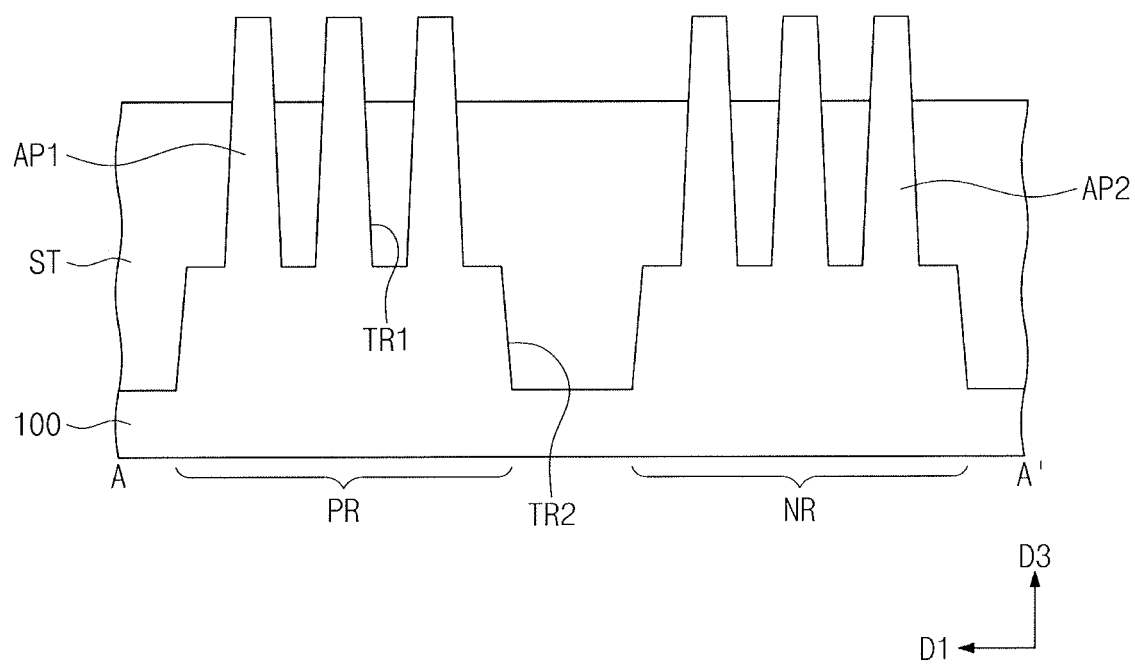
FIGS. 21, 23A, 25A, 27A, and 29A illustrate cross-sectional views taken along line A-A' of FIGS. 20, 22, 24, 26, and 28, respectively.
Figure 22:
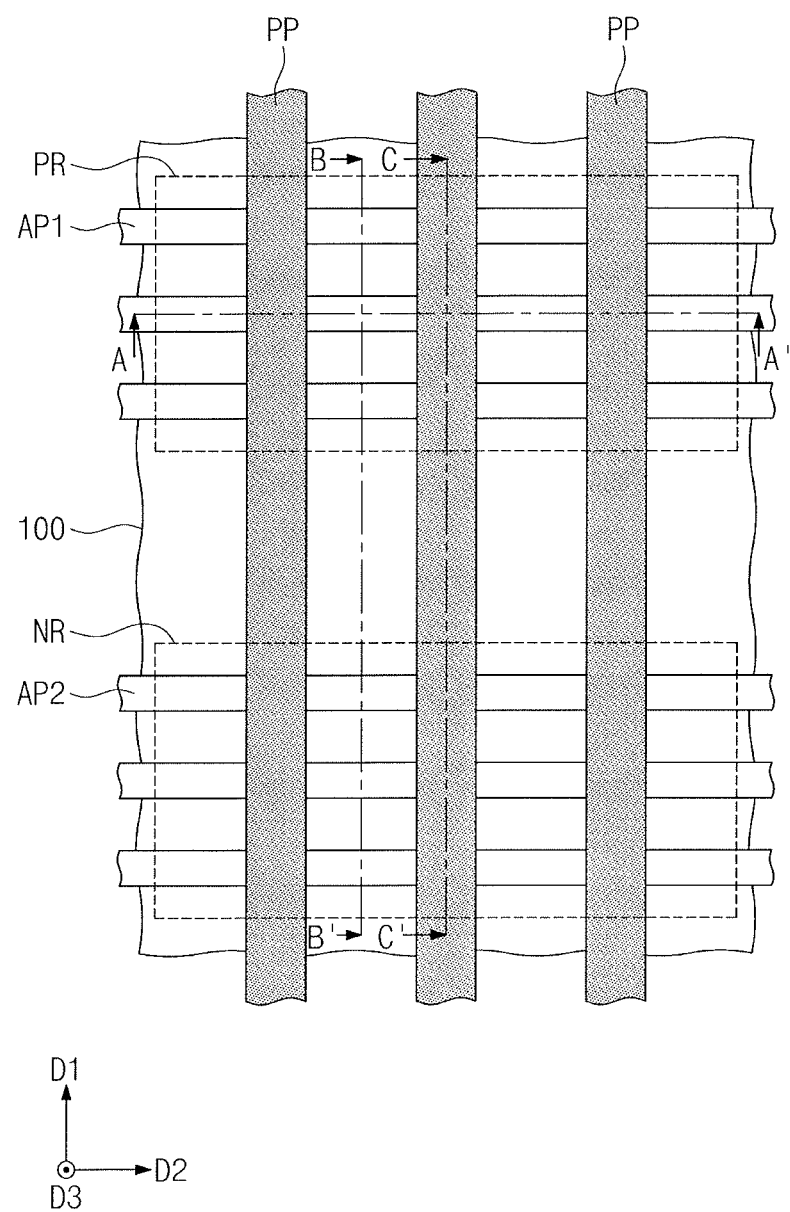
Figure 23A:
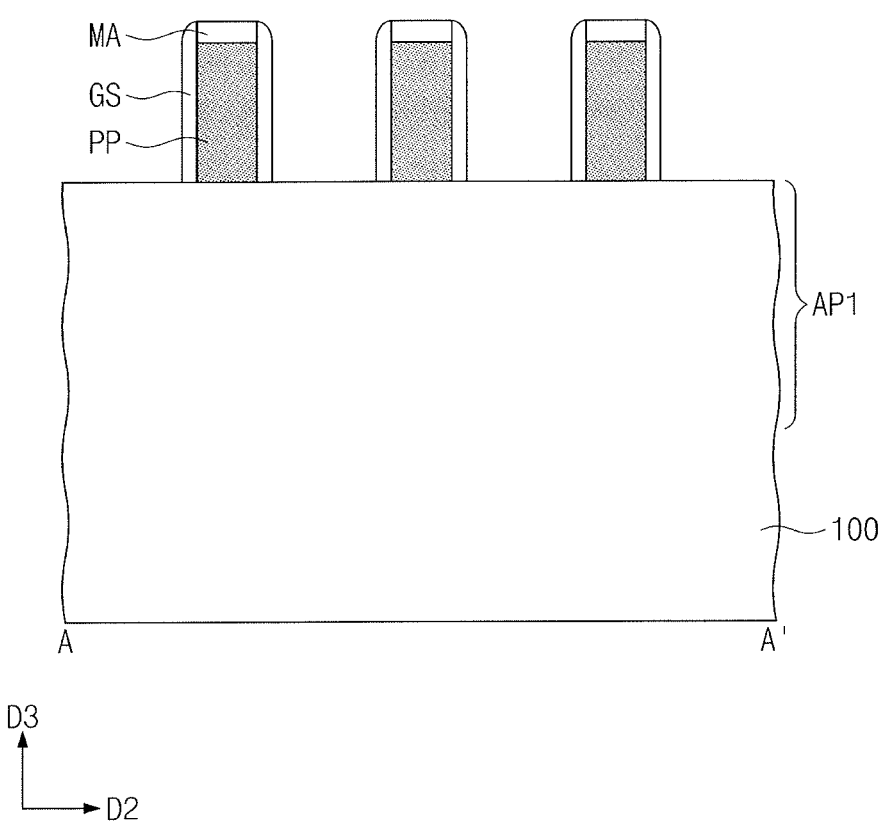
Figure 23B:
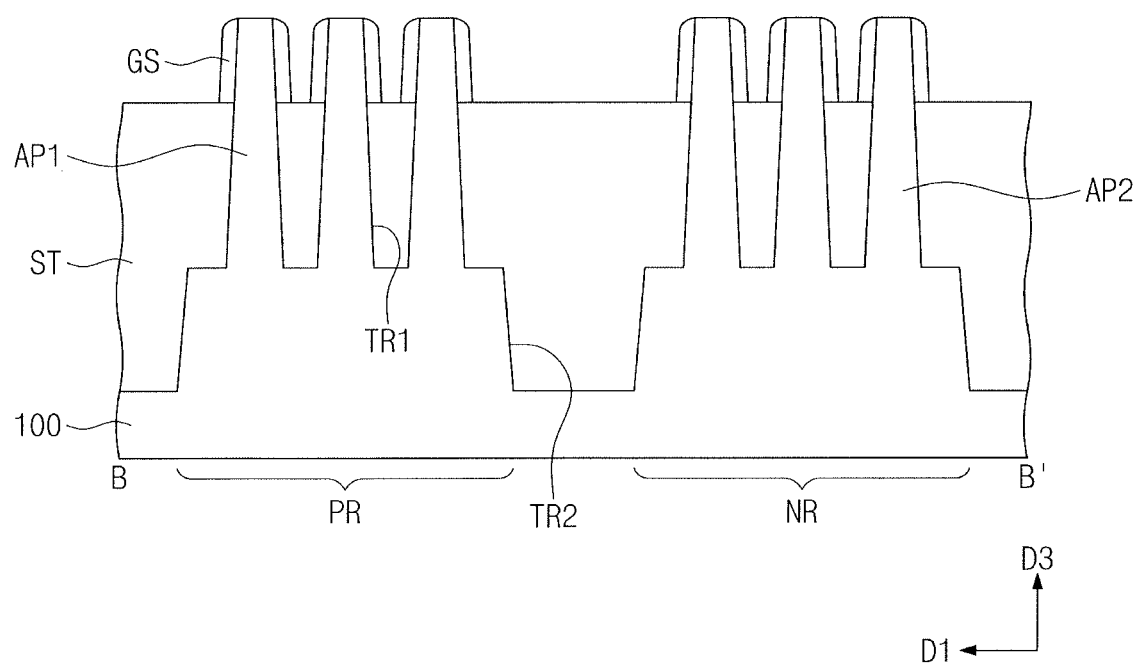
FIGS. 23B, 25B, 27B, and 29B illustrate cross-sectional views taken along line B-B' of FIGS. 22, 24, 26, and 28, respectively.
Figure 23C:
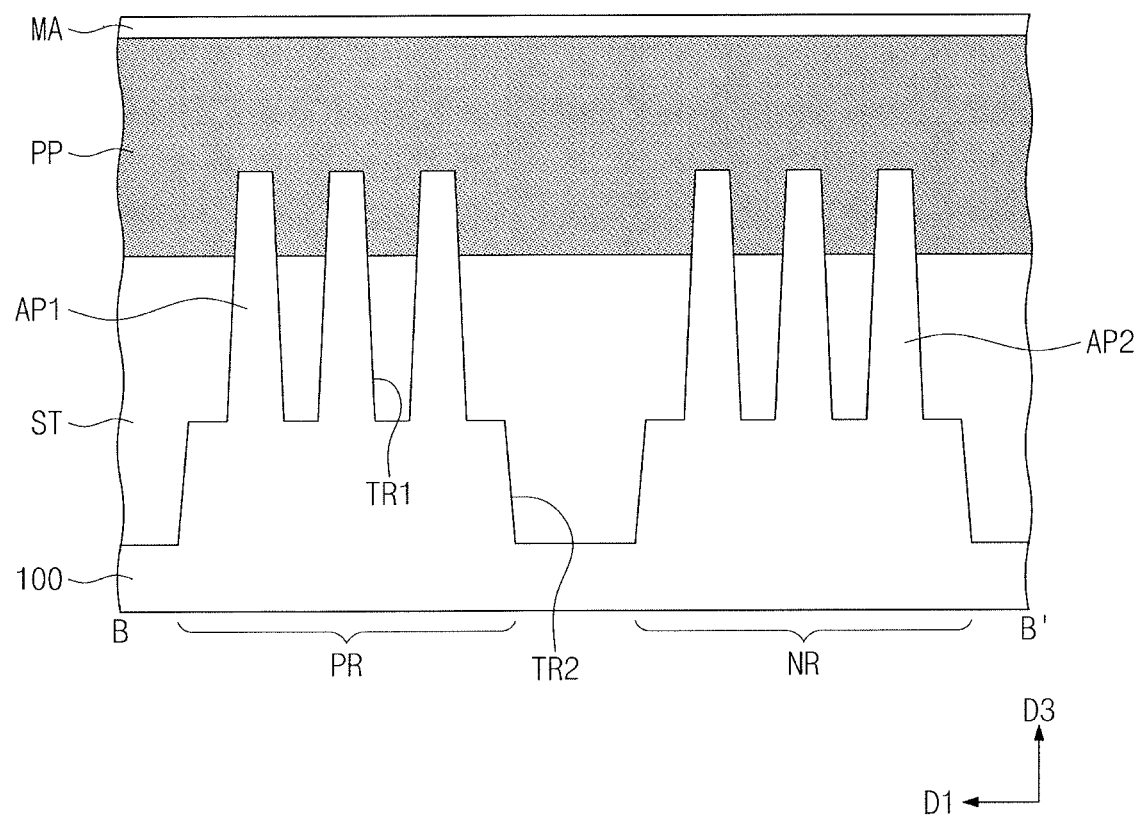
FIGS. 23C, 25C, 27C, and 29C illustrate cross-sectional views taken along line C-C' of FIGS. 22, 24, 26, and 28, respectively.
Figure 24:
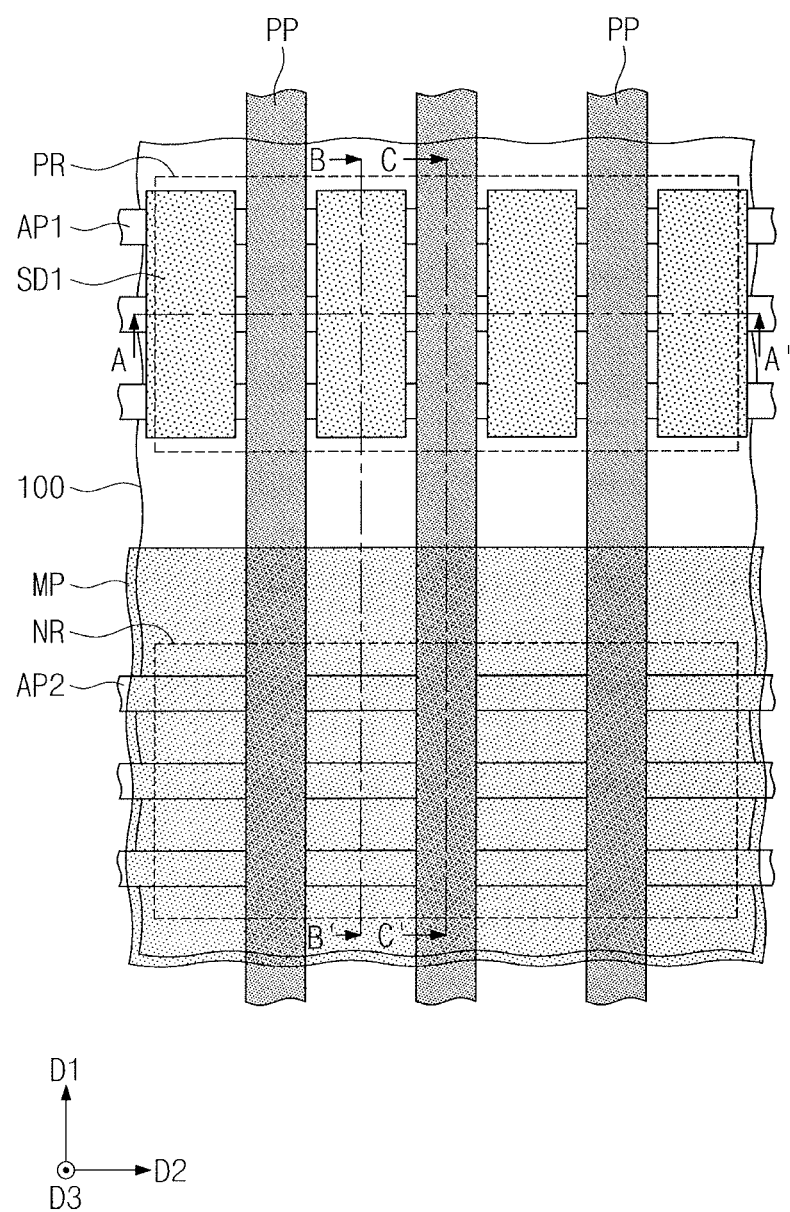

Referring to FIGS. 20 and 21, a substrate 100 may be patterned to form active patterns AP1 and AP2. The active patterns AP1 and AP2 may be formed to have at a regular interval (or pitch). A first trench TR1 may be formed between a pair of neighboring active patterns AP1 and AP2. The first trenches TR1 may have substantially the same depth.

The substrate 100 may be patterned to form a second trench TR2 that defines a PMOSFET region PR and a NMOSFET region NR. The second trench TR2 may be formed deeper than the first trench TR1. One or more of the active patterns AP1 and AP2 may be removed when the substrate 100 is patterned, and thus first active patterns AP1 may remain on the PMOSFET region PR and second active patterns AP2 may remain on the NMOSFET region NR.

A device isolation layer ST may be formed to fill the first and second trenches TR1 and TR2. The formation of the device isolation layer ST may include forming on the substrate 100 a dielectric layer (e.g., a silicon oxide layer) to cover the first and second active patterns AP1 and AP2, and recessing the dielectric layer until upper portions of the first and second active patterns AP1 and AP2 are exposed.

Referring to FIGS. 22 and 23A to 23C, sacrificial patterns PP may be formed to run across the first and second active patterns AP1 and AP2. A pair of gate spacers GS may be formed on opposite sidewalls of each of the sacrificial patterns PP. The gate spacers GS may also be formed on opposite sidewalls of the upper portion of each of the first and second active patterns AP1 and AP2.

Referring to FIGS. 24 and 25A to 25C, recesses RS may be formed on the upper portion of each of the first and second active patterns AP1 and AP2. A first hardmask pattern MP may be formed to selectively cover the second active patterns AP2. The first hardmask pattern MP may expose the first active patterns AP1. First source/drain patterns SD1 may be formed to fill the recesses RS of the exposed first active patterns AP1.

For example, a first semiconductor pattern SP1 may be formed in each of the recesses RS. A second semiconductor pattern SP2 may be formed on each of the first semiconductor patterns SP1. A third semiconductor pattern SP3 may be formed on the second semiconductor patterns SP2 adjacent to each other in a second direction D2. The formation of the third semiconductor pattern SP3 may include growing epitaxial patterns using the second semiconductor patterns SP2 as seed layers, and then merging the epitaxial patterns into a single piece. A fourth semiconductor pattern SP4 may be formed on the third semiconductor pattern SP3. Except for that mentioned above, the formation of the first to fourth semiconductor patterns SP1 to SP4 may be substantially the same as that discussed above with reference to FIGS. 9 and 10A to 10C.

In an implementation, the formation of the first source/drain pattern SD1 may further include forming a fifth semiconductor pattern SP5 on the third semiconductor pattern SP3 before forming the fourth semiconductor pattern SP4. The first to fifth semiconductor patterns SP1 to SP5 may constitute a body part BP of the first source/drain pattern SD1.

The third semiconductor pattern SP3 may be formed to include valleys VAL. For example, the third semiconductor pattern SP3 may have a top surface including a first surface TS1 and a second surface TS2 adjacent to each other. Each of the first and second surfaces TS1 and TS2 may be a (111) plane. The first surface TS1 and the second surface TS2 may define the valley VAL on the top surface of the third semiconductor pattern SP3.

The fifth semiconductor pattern SP5 may be formed by a selective epitaxial growth process in which the first and second surfaces TS1 and TS2 constituting the valley VAL are used as a seed layer. The fifth semiconductor pattern SP5 may be formed to fill the valley VAL, and may not be formed on different surfaces other than the first and second surfaces TS1 and TS2 of the third semiconductor pattern SP3. When the selective epitaxial growth process is adjusted on its process conditions (e.g., temperature, pressure, and etching gas amount), it may be possible to control selective growth of the fifth semiconductor pattern SP5 only on the first surface TS1 and the second surface TS2.

The body part BP may be formed to have a first facet FA1 and a second facet FA2. The first facet FA1 and the second facet FA2 may define a first corner edge SE1. A capping pattern CAP may be selectively formed on the second facet FA2 of the body part BP. The capping pattern CAP may not be formed on the first facet FA1 of the body part BP. The capping pattern CAP may not cover the first corner edge SE1.

Referring to FIGS. 26 and 27A to 27C, second source/drain patterns SD2 may be formed to fill the recesses RS of the second active patterns AP2. A first interlayer dielectric layer 110 may be formed on the substrate 100. Each of the sacrificial patterns PP may be replaced with a gate dielectric pattern GI, a gate electrode GE, and a gate capping pattern GP.

Referring to FIGS. 28 and 29A to 29C, a second interlayer dielectric layer 120 may be formed on the first interlayer dielectric layer 110. Contact holes CNH may be formed to penetrate the second interlayer dielectric layer 120 and the first interlayer dielectric layer 110, exposing the first and second source/drain patterns SD1 and SD2. Silicide layers SC may be formed by performing a silicidation process on the first and second source/drain patterns SD1 and SD2 exposed to the contact holes CNH.

Referring back to FIGS. 18 and 19A to 19C, active contacts AC may be formed in the contact holes CNH, contacting the first and second source/drain patterns SD1 and SD2.

By way of summation and review, semiconductor devices may have high integration with the advanced development of electronic industry. For example, semiconductor devices with high reliability, high speed, and/or multi-functionality may be desirable. Semiconductor devices may be gradually complicated and integrated to meet these characteristics.

According to an embodiment, a semiconductor device may be configured such that a contact area between a source/drain pattern and an active contact (or a silicide layer) is increased while the source/drain pattern maintains its maximum width. A resistance between the source/drain pattern and the active contact may be reduced to help improve electrical characteristics of the semiconductor device. According to an embodiment, this may be realized by providing a capping layer.

One or more embodiments may provide a semiconductor device having increased integrated and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
 a substrate including a plurality of active fins that are adjacent to each other;
 a gate electrode running across the plurality of active fins;
 a source/drain pattern adjacent to one side of the gate electrode and on the plurality of active fins;
 an active contact electrically connected to the source/drain pattern; and
 a silicide layer between the source/drain pattern and the active contact,
 wherein:
 the source/drain pattern includes:
  a body part including a plurality of first semiconductor patterns respectively on the plurality of active fins, a second semiconductor pattern on the plurality of first semiconductor patterns and connecting the plurality of first semiconductor patterns to each other, and a third semiconductor pattern on the second semiconductor pattern; and a capping pattern on the body part, the body part has a first facet, a second facet on the first facet, and a first corner edge defined where the first facet meets the second facet, the first corner edge protrudes parallel to the substrate, the first facet, the second facet and the first corner edge are adjacent to an outermost one of the plurality of active fins, the capping pattern covers the second facet and exposes the first facet and the first corner edge, the body part further has a third facet, a fourth facet on the third facet, and a second corner edge defined where the third facet meets the fourth facet, the second corner edge protrudes parallel to the substrate, the source/drain pattern has a maximum width between the first corner edge and the second corner edge, the capping pattern includes a first segment on the second facet, a second segment on the third facet, and a third segment on the second corner edge, the third segment is between the first segment and the second segment and connects the first and second segments to each other, a maximum thickness of the first segment is greater than a maximum thickness of the third segment, and a maximum thickness of the second segment is greater than the maximum thickness of the third segment.

2. The semiconductor device as claimed in claim 1, wherein:

the plurality of first semiconductor patterns include silicon-germanium, the second semiconductor pattern includes silicon-germanium having a higher germanium concentration than the first semiconductor pattern, and the third semiconductor pattern includes silicon in an amount of about 95 at % to about 100 at %.

3. The semiconductor device as claimed in claim 1, wherein:

the capping pattern includes germanium, and a germanium content of the capping pattern is about 5 at % to about 100 at %.

4. The semiconductor device as claimed in claim 1, wherein the silicide layer covers a top surface of the body part and a top surface of the capping pattern.

5. The semiconductor device as claimed in claim 1, wherein:

the third facet, the fourth facet and the second corner edge are adjacent to an opposite outermost one of the plurality of active fins, and the capping pattern covers the fourth facet and exposes the third facet and the second corner edge.

6. The semiconductor device as claimed in claim 5, wherein:

the capping pattern includes a first segment covering the second facet and a second segment covering the fourth facet, and the first and second segments are spaced apart from each other by an upper portion of the body part.

7. A semiconductor device, comprising:

a substrate including an active pattern;

a gate electrode running across the active pattern; and a source/drain pattern adjacent to one side of the gate electrode and on an upper portion of the active pattern, wherein:

the source/drain pattern includes:

a body part including a plurality of semiconductor patterns; and a capping pattern on the body part, the body part has a first facet, a second facet, a third facet, a fourth facet, a first corner edge defined where the first facet meets the second facet, a second corner edge defined where the second facet meets the third facet, and a third corner edge defined where the third facet meets the fourth facet, the first and third corner edges protrude parallel to the substrate, the second corner edge protrudes perpendicular to the substrate, the capping pattern covers the second facet, the third facet and the second corner edge between the second and third facets, the capping pattern exposes the first facet, the fourth facet, the first corner edge and the third corner edge, the capping pattern includes a first segment on the second facet, a second segment on the third facet, and a third segment on the second corner edge, the third segment is between the first segment and the second segment and connects the first and second segments to each other, a maximum thickness of the first segment is greater than a maximum thickness of the third segment, and a maximum thickness of the second segment is greater than the maximum thickness of the third segment.

8. The semiconductor device as claimed in claim 7, wherein:

the body part includes:

a first semiconductor pattern that is an outermost one of the plurality of semiconductor patterns; and a second semiconductor pattern between the first semiconductor pattern and the active pattern, the first semiconductor pattern includes silicon in an amount of about 95 at % to about 100 at %, and the second semiconductor pattern includes silicon-germanium.

9. The semiconductor device as claimed in claim 7, wherein:

the capping pattern includes germanium, and a germanium content of the capping pattern is about 5 at % to about 100 at %.

10. The semiconductor device as claimed in claim 7, wherein the source/drain pattern has a maximum width between the first corner edge and the third corner edge.

11. The semiconductor device as claimed in claim 10, wherein the capping pattern does not affect the maximum width of the source/drain pattern.

* * * * *